(12) United States Patent
Ono

(10) Patent No.: US 7,989,872 B2
(45) Date of Patent: Aug. 2, 2011

(54) NONVOLATILE SEMICONDUCTOR MEMORY ELEMENT AND NONVOLATILE SEMICONDUCTOR MEMORY DEVICE

(75) Inventor: Mizuki Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 111 days.

(21) Appl. No.: 11/889,547

(22) Filed: Aug. 14, 2007

(65) Prior Publication Data

US 2008/0073698 A1 Mar. 27, 2008

(30) Foreign Application Priority Data

Sep. 26, 2006 (JP) ................ 2006-260931

(51) Int. Cl.
*H01L 29/788* (2006.01)
(52) U.S. Cl. ........ 257/316; 257/314; 257/315; 257/365; 257/E29.129; 257/E29.3
(58) Field of Classification Search .......... 257/314, 257/315, 316, 365, E29.129, E29.3, E21.179
See application file for complete search history.

(56) References Cited

U.S. PATENT DOCUMENTS

| | | | | |
|---|---|---|---|---|
| 5,929,479 | A * | 7/1999 | Oyama | 257/315 |
| 6,054,734 | A | 4/2000 | Aozasa et al. | |
| 7,202,521 | B2 * | 4/2007 | Kim et al. | 257/314 |
| 7,294,881 | B2 * | 11/2007 | Korenari et al. | 257/314 |
| 7,310,268 | B2 * | 12/2007 | Kang et al. | 365/185.17 |
| 2005/0112815 | A1 | 5/2005 | Kim et al. | |
| 2005/0167668 | A1 | 8/2005 | Korenari et al. | |
| 2006/0138519 | A1 | 6/2006 | Kang et al. | |
| 2007/0114594 | A1 | 5/2007 | Ono | |

FOREIGN PATENT DOCUMENTS

| | | |
|---|---|---|
| CN | 1607668 A | 4/2005 |
| CN | 1652339 A | 8/2005 |
| JP | 3658564 | 3/2005 |
| JP | 2005-337228 | 12/2005 |

OTHER PUBLICATIONS

Ichige, et al.., "A novel self-aligned shallow trench isolation cell for 90nm 4Gbit NAND Flash EEPROMs", 2003 Symposium on VLSI Technology Digest of Technical Papers, pp. 88-90, (2003).

(Continued)

*Primary Examiner* — Evan Pert
*Assistant Examiner* — Eduardo A Rodela
(74) *Attorney, Agent, or Firm* — Finnegan, Henderson, Farabow, Garrett & Dunner, L.L.P.

(57) ABSTRACT

The channel of each nonvolatile semiconductor memory element has a plate-like shape, and a charge accumulating layer is formed on one face of the channel region, with an insulating film being interposed in between. A control gate electrode is then formed on the charge accumulating layer, with another insulating film being interposed in between. Another control gate electrode is formed on the other face of the channel region, with yet another insulating film being interposed in between. The plate-like semiconductor region is designed to have a thickness smaller than twice the largest depletion layer thickness determined by the impurity concentration. In this manner, variations of the threshold voltages varying with the voltage of the control gate electrodes can be made smaller than the minimum value in conventional elements. As a result, nonvolatile semiconductor memory elements that have higher controllability over threshold voltages and can lower the power supply voltage so as to reduce the power consumption can be provided.

14 Claims, 12 Drawing Sheets

OTHER PUBLICATIONS

Khouri, et al., "Program and Verify Word-Line Voltage Regulator for Multilevel Flash Memories", Analog Integrated Circuits and Signal Processing, vol. 34, pp. 119-131, (2003).

Notification of the First Office Action issued by the Chinese Patent Office on Dec. 11, 2009, for Chinese Patent Application No. 200710142431.1, and English-language translation thereof.

* cited by examiner

NONVOLATILE SEMICONDUCTOR MEMORY ELEMENT AND NONVOLATILE SEMICONDUCTOR MEMORY DEVICE

CROSS-REFERENCE TO RELATED APPLICATION

This application is based upon and claims the benefit of priority from prior Japanese Patent Application No. 2006-260931 filed on Sep. 26, 2006 in Japan, the entire contents of which are incorporated herein by reference.

BACKGROUND OF THE INVENTION

1. Field of the Invention

The present invention relates to nonvolatile semiconductor memory elements and a nonvolatile semiconductor memory device including the nonvolatile semiconductor memory elements.

2. Related Art

In a conventional nonvolatile semiconductor memory element, the potentials of the control gate electrode and the source/drain regions are controlled, so that charge injection into or charge release from the charge accumulating layer provided between the channel region and the control gate electrode is caused. In this manner, the charge amount in the charge accumulating layer is adjusted, so as to switch the threshold voltages of the element (or the control gate voltages to be switched between an ON state (a conductive state) and an OFF state (a nonconductive state) of the region between the source and drain of the element). Thus, information writing is performed.

In nonvolatile semiconductor memory elements of the above described type, the threshold voltage is switched between two values, so as to store 1-bit information in one element. Therefore, to achieve higher integration, more than 1-bit information needs to be stored in each memory element. As a method of storing more than 1-bit information in each one element, there has been a known method by which more than two different threshold voltages are obtained through fine adjustment of the charge amount in each charge accumulating layer (see Masayuki Ichige, et al., "A novel self-aligned shallow trench isolation cell for 90 nm 4-Gbit NAND Flash EEPROMs", in Technical Digest of 2003 Symposium on VLSI Technology, pp. 89-90, and Osama Khouri, et al. "Program and Verify Word-Line Voltage Regulator for Multilevel Flash Memories", in Analog Integrated Circuits and Signal Processing, vol. 34 (2003), pp. 119-131, for example).

By the method of obtaining two threshold voltages through fine adjustment of the charge amount in the charge accumulating layer, it is necessary to restrict a variation (hereinafter denoted by "$\Delta V_{TH}$") of each threshold voltage to a sufficiently small value. The reason for this requirement is as follows. The element described here is an n-type element. When 2-bit information is stored in each one element, it is necessary to adjust the threshold voltages in four ways. The lowest threshold voltage has a negative value, and the highest threshold voltage has a value higher than the power supply voltage (hereinafter denoted by "$V_{DD}$"). Meanwhile, there need to be two different threshold voltages between zero and the power supply voltage. Therefore, it is necessary to satisfy the relationship, $V_{DD} > 2 \times \Delta V_{TH}$. Here, a specific value of $\Delta V_{TH}$ in a case where a verifying function is not provided is reportedly about 2.3 V (see Masayuki Ichige, et al. "A novel self-aligned shallow trench isolation cell for 90 nm 4-Gbit NAND Flash EEPROMs", in Technical Digest of 2003 Symposium on VLSI Technology, pp. 89-90). A specific value of $\Delta V_{TH}$ in a case where a verifying function is provided is reportedly about 0.5 V (see Osama Khouri, et al. "Program and Verify Word-Line Voltage Regulator for Multilevel Flash Memories", in Analog Integrated Circuits and Signal Processing, vol. 34 (2003), pp. 119-131). Therefore, even in a case where a verifying function is provided, it is impossible to set $V_{DD}$ at a lower value than approximately $0.5V \times 2 = 1V$. This fact has greatly hindered the achievement of a low power supply voltage required to reduce power consumption.

SUMMARY OF THE INVENTION

The present invention has been made in view of these circumstances, and an object thereof is to provide high-performance nonvolatile semiconductor memory elements and high-performance nonvolatile semiconductor memory devices that have high controllability over threshold voltages, so as to have more than two different threshold voltages while lowering the power supply voltage.

A nonvolatile semiconductor memory element according to a first aspect of the present invention includes: a semiconductor region of a first conductivity type having a plate-like shape, on a semiconductor substrate; a first insulating film to cover a first face of the semiconductor region; a charge accumulating layer to cover the first insulating film; a second insulating film to cover the charge accumulating layer; a first control gate electrode to cover the second insulating film; a third insulating film to cover a second face of the semiconductor region, the second face being the opposite face to the first face; a second control gate electrode to cover the third insulating film; and source/drain regions of a second conductivity type sandwiching the charge accumulating layer, in the semiconductor region, the source/drain regions and the charge accumulating layer having at least one overlapping portion, wherein the semiconductor region has a thickness equal to or smaller than twice the largest depletion layer thickness determined by an impurity concentration in the semiconductor region, and the first control gate electrode and the second control gate electrode are electrically joined to each other.

A nonvolatile semiconductor memory element according to a second aspect of the present invention includes: a SOI substrate including a semiconductor supporting substrate, an embedded insulating film on the semiconductor supporting substrate, and a semiconductor layer of a first conductivity type on the embedded insulating film; source/drain regions of a second conductivity type in the semiconductor layer at a distance from each other; a first insulating film on a portion of the semiconductor layer, the portion being located between the source/drain regions; a charge accumulating layer on the first insulating film; a second insulating film on the charge accumulating layer; a first control gate electrode on the second insulating film; and a second control gate electrode in a portion of the semiconductor supporting substrate located immediately below the embedded insulating film, the second control gate electrode being perpendicular to the first control gate electrode, wherein: the source/drain regions sandwich the charge accumulating layer and are formed in the semiconductor layer, the source/drain regions and the charge accumulating layer having at least one overlapping portion; and the semiconductor layer has a thickness equal to or smaller than twice the largest depletion layer thickness determined by an impurity concentration in the semiconductor layer.

A nonvolatile semiconductor memory device according to a third aspect of the present invention includes: a plurality of nonvolatile semiconductor memory elements according to the first aspect, wherein: the nonvolatile semiconductor memory elements are arranged in a lattice form; the source/ drain regions of each two neighboring ones of the nonvolatile semiconductor memory elements arranged in the same row are connected to each other; and the first and second control gate electrodes of the nonvolatile semiconductor memory elements arranged in the same column are connected to one another.

A nonvolatile semiconductor memory device according to a fourth aspect of the present invention includes: a plurality of nonvolatile semiconductor memory elements according to the second aspect, wherein: the nonvolatile semiconductor memory elements are arranged in a lattice form; the source/ drain regions of each two neighboring ones of the nonvolatile semiconductor memory elements arranged in the same row are connected to each other; the first control gate electrodes of the nonvolatile semiconductor elements arranged in the same column are connected to one another; and the second control gate electrodes of the nonvolatile semiconductor elements arranged in the same row are connected to one another.

DETAILED DESCRIPTION OF THE INVENTION

The following is a detailed description of embodiments of the present invention, with reference to the accompanying drawings. It should be noted that the present invention is not limited to the following embodiments, and various changes and modifications may be made to them.

First Embodiment

A nonvolatile semiconductor memory element in accordance with a first embodiment of the present invention includes a charge accumulating layer that is formed on one side face of a plate-like semiconductor region serving as a channel region via an insulating film, a first control gate electrode that is formed on the charge accumulating layer via an insulating film, and a second control gate electrode that is formed on the other side face of the plate-like semiconductor region serving as the channel region via an insulating film.

With such a structure, higher controllability over the threshold voltages than that of a conventional nonvolatile semiconductor memory element can be achieved. This fact is explained in the following.

To inject charges into a charge accumulating layer or to release charges from the charge accumulating layer, a tunneling current is used. The tunneling current flows through an insulating film existing between a plate-like semiconductor region serving as a channel region and the charge accumulating layer (the insulating film being hereinafter referred to as the "tunnel gate insulating film"). The tunneling current is not such a current that varies in a discontinuous fashion, as in cases where the current flows when the voltage conditions for the control gate electrode, the source/drain regions, and the substrate are predetermined conditions, and the current does not flow when the voltage conditions are different from the predetermined conditions. The voltage conditions under which the current value becomes equal to a predetermined value when charges are injected to the charge accumulating layer or charges are released from the charge accumulating layer, or the voltage conditions under which the electric field in the tunnel gate insulating film becomes equal to a predetermined value when charges are injected to the charge accumulating layer or charges are released from the charge accumulating layer, is referred to as the "write voltage conditions" and the "erase voltage conditions", which can clearly define the above described conditions. In this specification, those terms are used in the above described sense.

Figure 1:
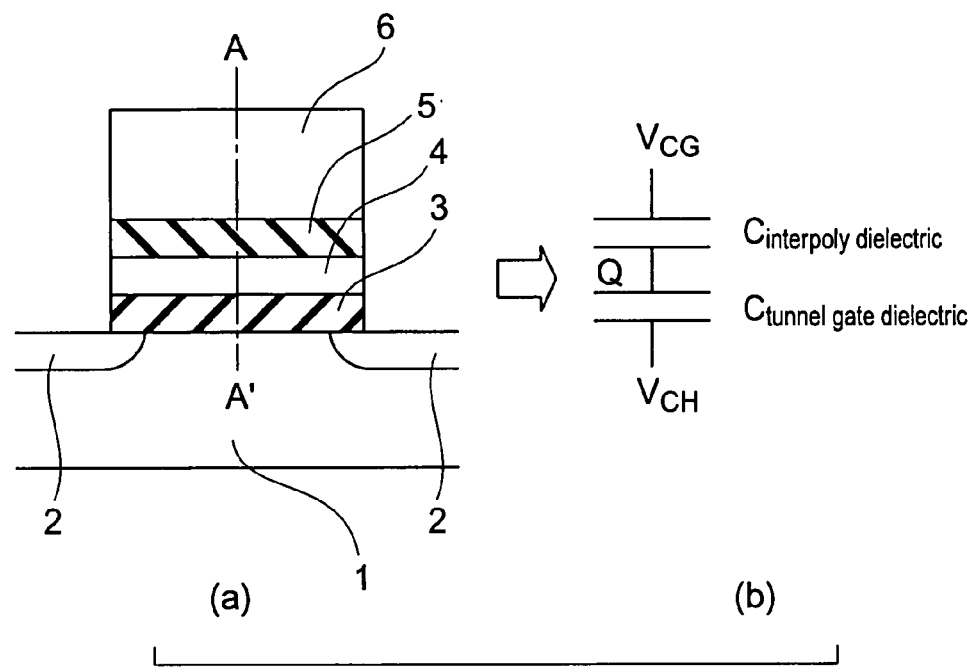
FIGS. 1(a) and 1(b) are diagrams for explaining a nonvolatile semiconductor memory element as a comparative example.

As a comparative example of this embodiment, FIGS. 1(a) and 1(b) show a nonvolatile semiconductor memory element that includes one charge accumulating layer and one control gate electrode. FIG. 1(a) is a schematic cross-sectional view of the nonvolatile semiconductor memory element, taken along in a direction parallel to the current flowing through the channel. In the nonvolatile semiconductor memory element of this comparative example, source/drain regions 2 are formed in a semiconductor substrate 1 at a distance from each other, and a tunnel gate insulating film 3 is formed on a portion of the semiconductor substrate 1 located between the source/drain regions 2. A charge accumulating layer 4 is formed on the tunnel gate insulating film 3, and an insulating film 5 is formed on the charge accumulating layer 4 (the insulating film 5 will be hereinafter referred to as the "interpoly insulating film 5"). A control gate electrode 6 is formed on the interpoly insulating film 5. When seen as a one-dimensional section taken along the line A-A' of FIG. 1(a) for ease of explanation, the stack structure formed with the semiconductor substrate 1 serving as the channel region, the tunnel gate insulating film 3, the charge accumulating layer 4, the interpoly insulating film 5, and the control gate electrode 6 is equivalent to a series connection of the capacitance $C_{interpoly\text{-}dielectric}$ of the interpoly insulating film 5 and the capacitance $C_{tunnel\text{-}gate\text{-}dielectric}$ of the tunnel gate insulating film 3, as shown in FIG. 1(b).

The potential of the control gate electrode 6 is represented by $V_{CG}$, the potential of the channel region is $V_{CH}$, and the charge amount in the charge accumulating layer 4 is Q. For the purpose of simplification, the tunneling current flowing through the tunnel gate insulating film 3 is considered to flow only when the electric field in the tunnel gate insulating film 3 becomes greater than a predetermined value. In other words, the voltage conditions under which the electric field in the tunnel gate insulating film 3 becomes equal to the predetermined value are the above mentioned write and erase voltage conditions. Here, an n-type element is employed. When writing is performed, charges are injected into the charge accumulating layer 4 if the potential $V_{CG}$ is higher by $\Delta V$ than the value set in accordance with the write voltage conditions. Since the charges injected here are negative charges, the electric field in the tunnel gate insulating film 3 becomes weaker as the charge injection progresses, and the charge injection later comes to a stop. The charge amount Q in the charge accumulating layer 4 in this situation is expressed as: $Q=-C_{interpoly\text{-}dielectric} \times \Delta V$. Accordingly, the threshold voltage $V_{TH}$ of the element in this situation is expressed as: $V_{TH}=V_{TH0}-Q/C_{interpoly\text{-}dielectric}=V_{TH0}+\Delta V$, wherein $V_{TH0}$ represents the threshold voltage at the time when no charges exist in the charge accumulating layer 4. Accordingly, the expression, $\partial V_{TH}/\partial V_{CG}=1$, is established.

As for erasing, the expression, $\partial V_{TH}/\partial V_{CG}=1$, is also established, with the same consideration as above being given. To control the threshold voltage with certain precision, it is necessary to control the potential of the control gate electrode 6 at the time of writing and erasing with the same precision as the precision required for controlling the threshold voltage. To release charges from the charge accumulating layer 4 at the time of erasing, a negative voltage with respect to the semiconductor substrate 1 may be applied to the control gate electrode 6, so that electrons are released to the semiconductor substrate 1. Alternatively, a negative potential with respect to the source/drain regions 2 may be applied to the control gate electrode 6, so that electrons are released to the source/drain regions 2. To release electrons to the source/drain regions 2, the source/drain regions 2 and the charge accumulating layer 4 need to be designed to have overlapping portions.

Figure 2:
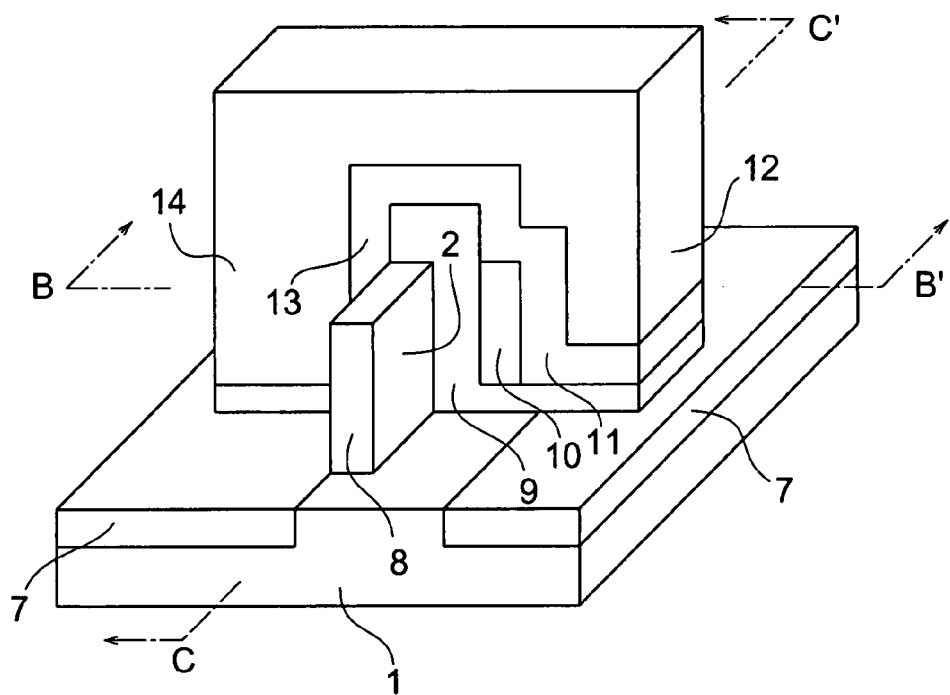
FIG. 2 is a perspective view of a nonvolatile semiconductor memory element in accordance with a first embodiment of the present invention.

Next, the nonvolatile semiconductor memory element of this embodiment is described. FIG. 2 is a schematic perspective view of the nonvolatile semiconductor memory element of this embodiment. In this nonvolatile semiconductor memory element, a pair of device isolating regions 7 are formed on a semiconductor substrate 1 at a distance from each other, and a plate-like semiconductor region 8 serving as a channel region is formed on a portion of the semiconductor substrate 1 located between the device isolating regions 7. A first insulating film 9 to be a tunnel gate insulating film is formed so as to cover one side face of the plate-like semiconductor region 8, and a charge accumulating layer 10 is formed so as to cover the first insulating film 9. A second insulating film 11 to be an interpoly insulating film is formed so as to cover the charge accumulating layer 10, and a first control gate electrode 12 is formed so as to cover the second insulating film 11.

A third insulating film 13 is formed so as to cover the other side face of the plate-like semiconductor region 8 serving as the channel region, and a second control gate electrode 14 is formed so as to cover the third insulating film 13. In the plate-like semiconductor region 8 serving as the channel region, source/drain regions 2 are formed so that the charge accumulating layer 10 is interposed in between.

The plate-like semiconductor region 8 serving as the channel region is designed to have a thickness smaller than twice the largest thickness a depletion layer can have in accordance with the impurity concentration in the region. Here, "the largest thickness a depletion layer can have in accordance with the impurity concentration in the region" is the thickness of a depletion layer that is formed in a case where a sufficiently thick semiconductor substrate having the same impurity concentration as that of the region is employed, and a voltage equal to the value obtained by dividing the forbidden band width of silicon (1.1 eV) by the elementary charge ($1.6 \times 10^{-19}$ C) is applied to the surface of the substrate as opposed to the bottom face of the substrate.

In FIG. 2, the source/drain regions behind the first and second control gate electrodes 12 and 14 are not shown, since a half of the view of the source/drain regions is blocked by the first and second control gate electrodes 12 and 14. Also, an interlayer insulating film, wiring metals, and the likes are not shown in FIG. 2. In this embodiment, the second insulating film 11 and the third insulating film 13 are integrally formed, and the first control gate electrode 12 and the second control gate electrode 14 are integrally formed as an electrically joined component. Accordingly, the number of terminals required is four: one for the first and second control gate electrodes as a unit, one for the substrate, one for the source region, and one for the drain region. This is the same wiring arrangement as that in a conventional nonvolatile semiconductor memory element, and this embodiment does not involve complication of the wiring arrangement.

Figure 3:
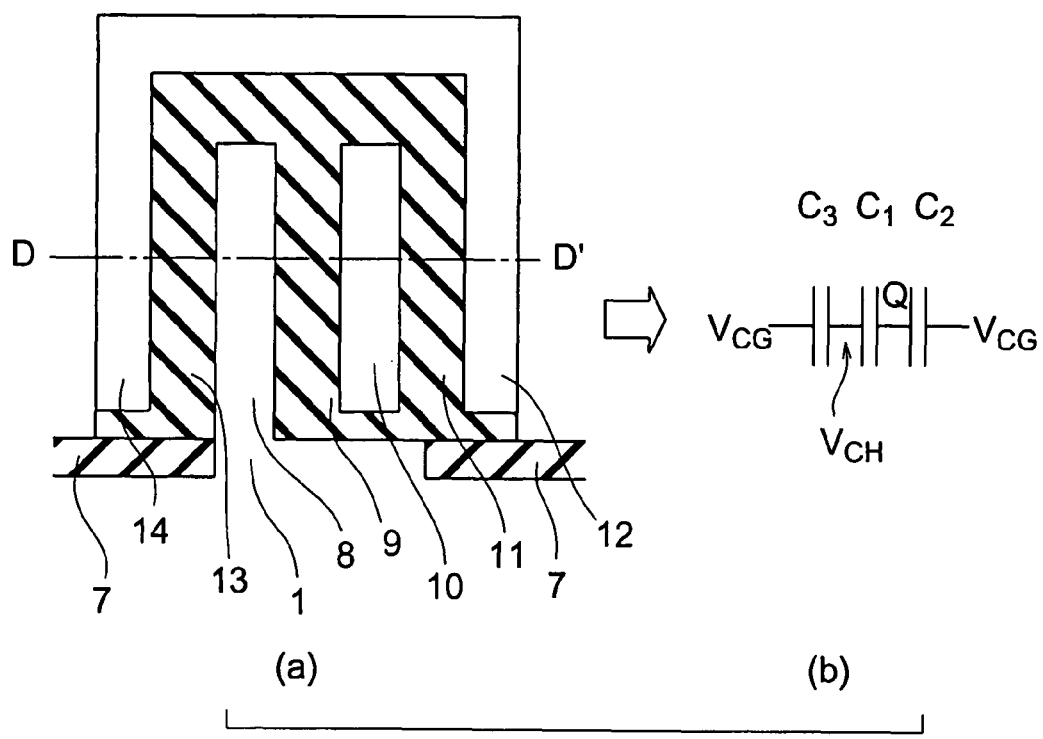
FIGS. 3(a) and 3(b) are diagrams for explaining the nonvolatile semiconductor memory element of the first embodiment.

FIG. 3(a) is a cross-sectional view of the nonvolatile semiconductor memory element, taken along the line B-B' of FIG. 2. A cross-section taken along the line D-D' of FIG. 3(a) is now described. When seen as a one-dimensional structure for the purpose of simplification, the stack structure formed with the plate-like semiconductor region 8 serving as the channel, the first insulating film 9, the charge accumulating layer 10, the second and third insulating films 11 and 13, and the first and second control gate electrodes 12 and 14 is equivalent to a series connection of capacitances $C_1$, $C_2$, and $C_3$ of the first through third insulating films 9, 11, and 13, as shown in FIG. 3(b). The common potential of the first and second control gate electrodes 12 and 14 (located on both sides in the equivalent circuit shown in FIG. 3(b)) is represented by $V_{CG}$, the potential of the channel region is $V_{CH}$, and the charge amount in the charge accumulating layer 10 is Q.

First, writing is described. Here, the nonvolatile semiconductor memory element is an n-type semiconductor memory element. A p-type nonvolatile semiconductor memory element should be exactly equivalent as the nonvolatile semiconductor memory element described here, if the impurity conductivity type and the voltage polarity are the opposite of the impurity conductivity type and the voltage polarity of the n-type nonvolatile semiconductor memory element. When the potential $V_{CG}$ is made higher by $\Delta V$ than the write voltage condition for the charge accumulating layer 10, charges are injected into the charge accumulating layer 10. Since the charges injected here are negative charges, the electric field in the tunnel gate insulating film 9 becomes weaker as the charge injection progresses, and the charge injection later comes to a stop. The charge amount Q in the charge accumulating layer 10 in this situation is expressed as: $Q=-C_2 \times \Delta V$. In the nonvolatile semiconductor memory element of this embodiment, the plate-like semiconductor region 8 serving as the channel region is designed to have a thickness smaller than twice the largest thickness a depletion layer can have in accordance with the impurity concentration in the region. Therefore, the channel formed in the plate-like semiconductor region 8 is affected by the voltage applied to the control gate electrodes 12 and 14 and the charge amount in the charge accumulating layer 10.

Here, the threshold voltage of the element is defined as the value of the control gate voltage with which the highest potential in the channel becomes equal to a predetermined value. With this definition, the threshold voltage $V_{TH}$ of the element in this situation is expressed as follows, with the use of the threshold voltage $V_{TH0}$, which is the threshold voltage observed in a case where no charges exist in the charge accumulating layer 10. In the following, the thicknesses of the first through third insulating films 9, 11, and 13 are represented by $T_1$, $T_2$, and $T_3$, respectively. The dielectric constants are $\in_1$, $\in_2$, and $\in_3$, respectively. The thickness of the plate-like semiconductor region 8 serving as the channel is $T_{ch}$, and the impurity concentration is N. The elementary charge is q. The capacitances $C_1$, $C_2$, and $C_3$, are expressed as $\in_1/T_1$, $\in_2/T_2$, and $\in_3/T_3$, respectively.

(1) In the case where $T_3/\in_3 > T_1/\in_1 + T_2/\in_2$ $V_{TH} = V_{TH0} + \Delta V \times (1/C_{ch} + 1/C_3)/(1/C_{ch} + 1/C_1 + 1/C_2 + 1/C_3)$, when $|Q| \leq qNT_{ch}/2 \times C_2 \times (T_3/\in_3 - (T_1/\in_1 + T_2/\in_2))$ $V_{TH} = V_{TH0} + (qNT_{ch}/2C_{ch} \times (T_3/\in_3 - (T_1/\in_1 + T_2/\in_2)) + \Delta V \times 1/C_3)/(1/C_{ch} + 1/C_1 + 1/C_2 + 1/C_3)$, when $|Q| > qNT_{ch}/2 \times C_2 \times (T_3/\in_3 - (T_1/\in_1 + T_2/\in_2))$ (2) In the case where $T_3/\in_3 < T_1/\in_1 + T_2/\in_2$ $V_{TH} = V_{TH0} + \Delta V \times 1/C_3/(1/C_{ch} + 1/C_1 + 1/C_2 + 1/C_3)$, regardless of the value of $|Q|$ Here, $C_{ch}$ is the value obtained by dividing the dielectric constant of the plate-like semiconductor region 8 serving as the channel by the thickness $T_{ch}$. This is a fact newly discovered through the study made for this invention. Accordingly, the following relationships are established with respect to $\partial V_{TH}/\partial V_{CG}$.

(1) In the case where $T_3/\in_3 > T_1/\in_1 + T_2/\in_2$ $\partial V_{TH}/\partial V_{CG} = (1/C_{ch} + 1/C_3)/(1/C_{ch} + 1/C_1 + 1/C_2 + 1/C_3)$, when $|Q| \leq qNT_{ch}/2 \times C_2 (T_3/\in_3 - (T_1/\in_1 + T_2/\in_2))$ $\partial V_{TH}/\partial V_{CG} = 1/C_3/(1/C_{ch} + 1/C_1 + 1/C_2 + 1/C_3)$, when $|Q| > qNT_{ch}/2 \times C_2 (T_3/\in_3 - (T_1/\in_1 + T_2/\in_2))$ (2) In the case where $T_3/\in_3 \leq T_1/\in_1 + T_2/\in_2$ $\partial V_{TH}/\partial V_{CG} = 1/C_3/(1/C_{ch} + 1/C_1 + 1/C_2 + 1/C_3)$, regardless of the value of $|Q|$ Accordingly, the relationship, $|\partial V_{TH}/\partial V_{CG}| < 1$, is established in all cases.

As for erasing, the relationship, $|\partial V_{TH}/\partial V_{CG}| < 1$, is also established in all cases, with the same consideration as above being given. The structure in accordance with this embodiment has the advantage of having high controllability over the threshold voltages. In other words, $\Delta V_{TH}$ can be advantageously restrained. Particularly, in the above described case (2) where $T_3/\in_3 \leq T_1/\in_1 + T_2/\in_2$, when either side of the equation is multiplied by the dielectric constant of silicon oxide, the left side represents the equivalent oxide thickness of the third insulating film 13 (an equivalent oxide thickness is defined by the value obtained by dividing the product of the thickness of an insulating film and the dielectric constant of silicon oxide by the dielectric constant of the insulating film). The right side represents the sum of the equivalent oxide thicknesses of the first insulating film 9 and the second insulating film 11. In such a case, the in equation, $T_3/\in_3 \leq T_1/\in_1 + T_2/\in_2$, can be rewritten as $1/C_3 \leq 1/C_1 + 1/C_2$. Accordingly, the relationship, $|\partial V_{TH}/\partial V_{CG}| < 1/2$, is established. Thus, even higher controllability over the threshold voltages can be achieved, and $\Delta V_{TH}$ is more restrained. Therefore, the sum of the equivalent oxide thicknesses of the first insulating film 9 and the second insulating film 11 is preferably equal to or greater than the equivalent oxide thickness of the third insulating film 13. This is also a fact newly discovered through this study. This fact implies that an increase is preferable in the capacitive coupling between the second control gate electrode 14 and the plate-like semiconductor region 8 serving as the channel region via the third insulating film 13.

However, the third insulating film 13 being very thin is not preferable, because it leads to an increase in the leakage current through the third insulating film 13. To prevent an increase in the leakage current through the third insulating film 13 and to strengthen the capacitive coupling between the second control gate electrode 14 and the plate-like semiconductor region 8 serving as the channel region via the third insulating film 13, the third insulating film 13 should preferably be made of a material with a high dielectric constant. Therefore, the dielectric constant of the third insulating film 13 is preferably equal to or higher than the dielectric constant of the first insulating film 9. This is also a fact newly discovered through this study.

There have been structures in which charge accumulating layers are provided on both sides of the plate-like semiconductor region 8 serving as the channel region via insulating films, and the control gate electrodes are provided via insulating films (see JP-A 2005-337228 (KOKAI), filed by the applicant). In such a structure, there is the need to form at least two insulating films between the channel region and the control gate electrode on either side of the channel region. Therefore, it is difficult to restrict the sum of the equivalent oxide thicknesses of the insulating films on one of the sides to a small value.

As mentioned above, high controllability over the threshold voltages can be achieved, as the channel formed in the plate-like semiconductor region 8 is affected by the voltage applied to the control gate electrodes 12 and 14 and the charge amount in the charge accumulating layer 10. Therefore, it is essential that the thickness of the plate-like semiconductor region 8 serving as the channel region is smaller than twice the largest thickness a depletion layer can have in accordance with the impurity concentration in the region.

Information writing is performed by adjusting the charge amount in the charge accumulating layer 10, and the charge amount in the charge accumulating layer 10 is adjusted by controlling the tunneling current flowing through the first insulating film 9. The tunneling current flowing through the first insulating film 9 is controlled by applying a potential to the control gate electrode 12 and thus controlling the electric field in the first insulating film 9. Judging from this fact, a large portion of the potential difference between the channel region and the control gate electrode should preferably be applied between the charge accumulating layer 10 and the channel region. The potential difference between the channel region and the control gate electrode 12 is divided into the potential difference between the channel region and the charge accumulating layer 10 and the potential difference between the charge accumulating layer 10 and the control gate electrode 12. The ratio of the potential difference between the channel region and the charge accumulating layer 10 to the potential difference between the charge accumulating layer 10 and the control gate electrode 12 is equal to the inverse ratio of the capacitance $C_1$ formed between the channel region and the charge accumulating layer 10 via the first insulating film 9 to the capacitance $C_2$ formed between the charge accumulating layer 10 and the control gate electrode 12 via the second insulating film 11. Therefore, the capacitance $C_2$ is preferably higher than the capacitance $C_1$. This implies that the equivalent oxide thickness of the first insulating film 9 should preferably be equal to or greater than the equivalent oxide thickness of the second insulating film 11.

However, the second insulating film 11 being very thin is not preferable, because it leads to an increase in the leakage current through the second insulating film 11. To prevent an increase in the leakage current through the second insulating film 11 and to strengthen the capacitive coupling between the channel region and the control gate electrode 12 via the second insulating film 11, the second insulating film 11 should preferably be made of a material with a high dielectric constant. Therefore, the dielectric constant of the second insulating film 11 is preferably equal to or higher than the dielectric constant of the first insulating film 9. This is also a fact newly discovered through this study.

For the above described reasons, very high controllability over the threshold voltages can be achieved in a nonvolatile semiconductor memory element of this embodiment having the same wiring arrangement as that of a conventional nonvolatile semiconductor memory element.

Next, a method for manufacturing nonvolatile semiconductor memory elements in accordance with this embodiment is described. In the following, a method for manufacturing two elements at the same time is described. FIGS. 4 through 9 are cross-sectional views, taken along the line B-B' of FIG. 2.

Figure 4:
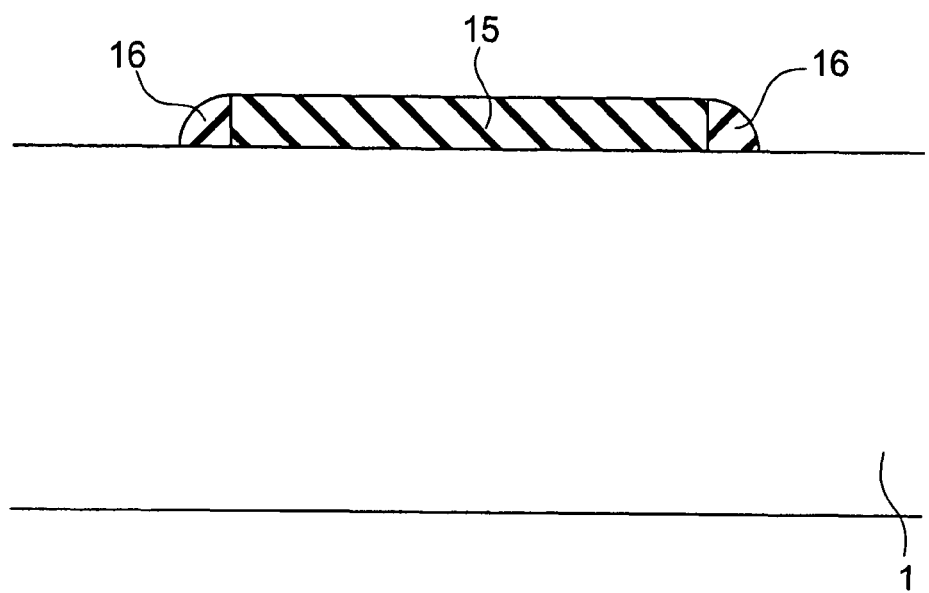
FIGS. 4 through 10 are cross-sectional views showing the procedures for manufacturing the nonvolatile semiconductor memory element of the first embodiment.

First, as shown in FIG. 4, B ions, for example, are injected into a semiconductor substrate 1 with an energy of 30 keV and a concentration of $1\times10^{12}$ cm$^{-2}$, and the semiconductor substrate 1 is subjected to heat treatment at 1050° C. for 30 seconds. A silicon nitride film 15 of 30 nm in thickness, for example, is formed on the semiconductor substrate 1 by the chemical vapor deposition method (hereinafter referred to as "CVD") or the like and patterned. A silicon oxide film of 20 nm in thickness, for example, is then formed on the entire surface of the semiconductor substrate 1 including the silicon nitride film 15 by CVD or the like. The silicon oxide film is subjected to reactive ion etching (hereinafter referred to as "RIE"), so as to form silicon oxide sidewalls 16.

Figure 5:
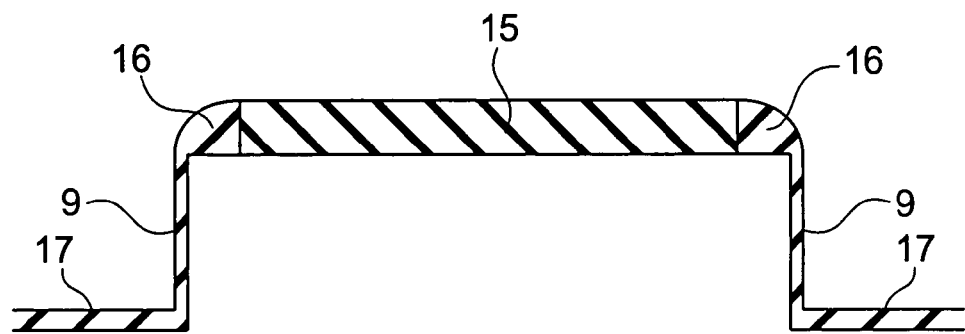

As shown in FIG. 5, the semiconductor substrate 1 is processed by RIE or the like. The semiconductor substrate 1 is then oxidized by a heat oxidization technique or the like, so as to form silicon oxide films to be first insulating films 9 on the sides of the processed region, and silicon oxide films 17 on the surface of the semiconductor substrate 1.

Figure 6:
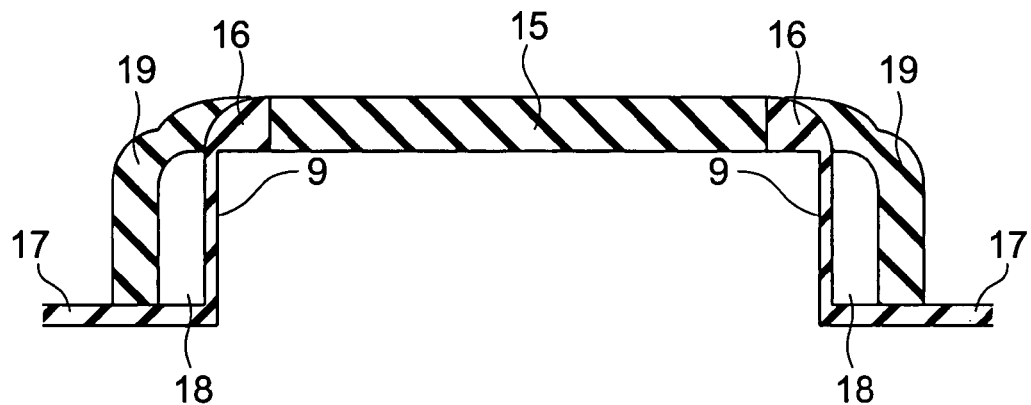

As shown in FIG. 6, a 20-nm thick polycrystalline silicon film containing As, for example, is formed by CVD or the like on the entire surface on the semiconductor substrate 1 including the silicon nitride film 15, the silicon oxide sidewalls 16, the first insulating films 9, and the silicon oxide films 17. The polycrystalline silicon film is then subjected to RIE or the like, so as to form polycrystalline silicon sidewalls 18. A hafnium oxide film of 20 nm in thickness, for example, is formed by CVD or the like, and the hafnium oxide film is processed by RIE or the like, so that the hafnium oxide film can remain on the side faces and the upper faces of the polycrystalline silicon sidewalls 18. In this manner, hafnium oxide sidewalls 19 are formed.

Figure 7:
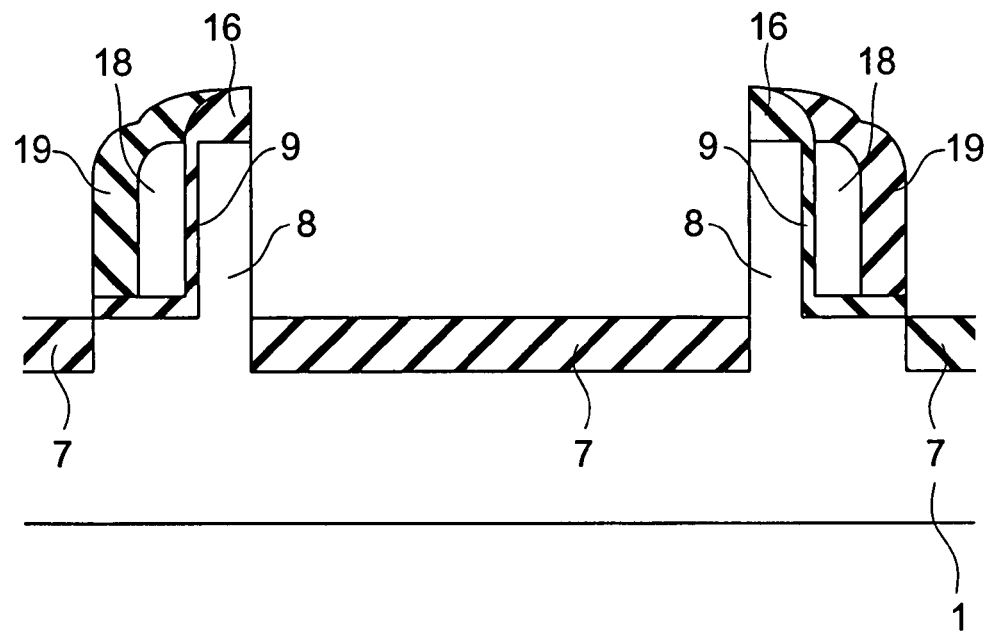

As shown in FIG. 7, the silicon nitride film 15 is removed through thermal phosphoric acid treatment or the like, for example. The silicon oxide films 17 are then removed through a hydrofluoric acid treatment or the like, for example. At this point, the silicon oxide sidewalls 16 and the hafnium oxide sidewalls 19 are also slightly thinned. However, since the silicon oxide sidewalls 16 and the hafnium oxide sidewalls 19 are thicker than the silicon oxide film 17, the silicon oxide sidewalls 16 and the hafnium oxide sidewalls 19 remain. The semiconductor substrate 1 is then processed further by RIE or the like, so that plate-like semiconductor regions 8 forming channel regions are formed, and grooves are formed in the other areas. The grooves are then filled with silicon oxide or the like, so as to form device isolating regions 7.

Figure 8:
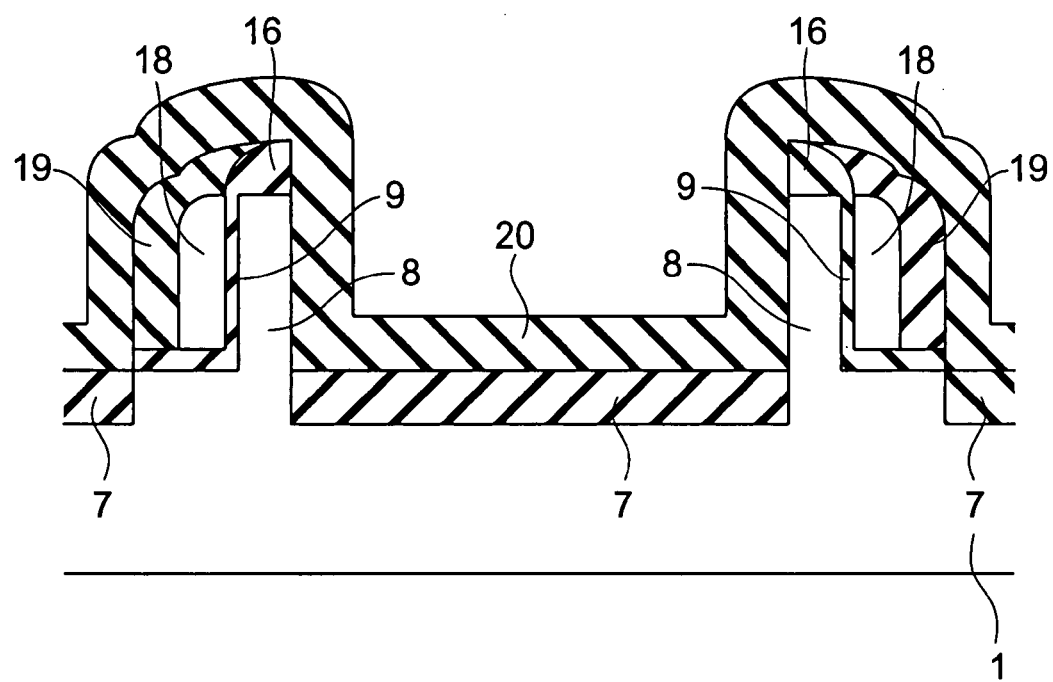

As shown in FIG. 8, a hafnium oxide film 20 of 100 nm in thickness, for example, is then formed by CVD or the like on the entire surface of the semiconductor substrate 1 including the device isolating regions 7, the plate-like semiconductor regions 8, the silicon oxide sidewalls 16, and the hafnium oxide sidewalls 19.

Figure 9:
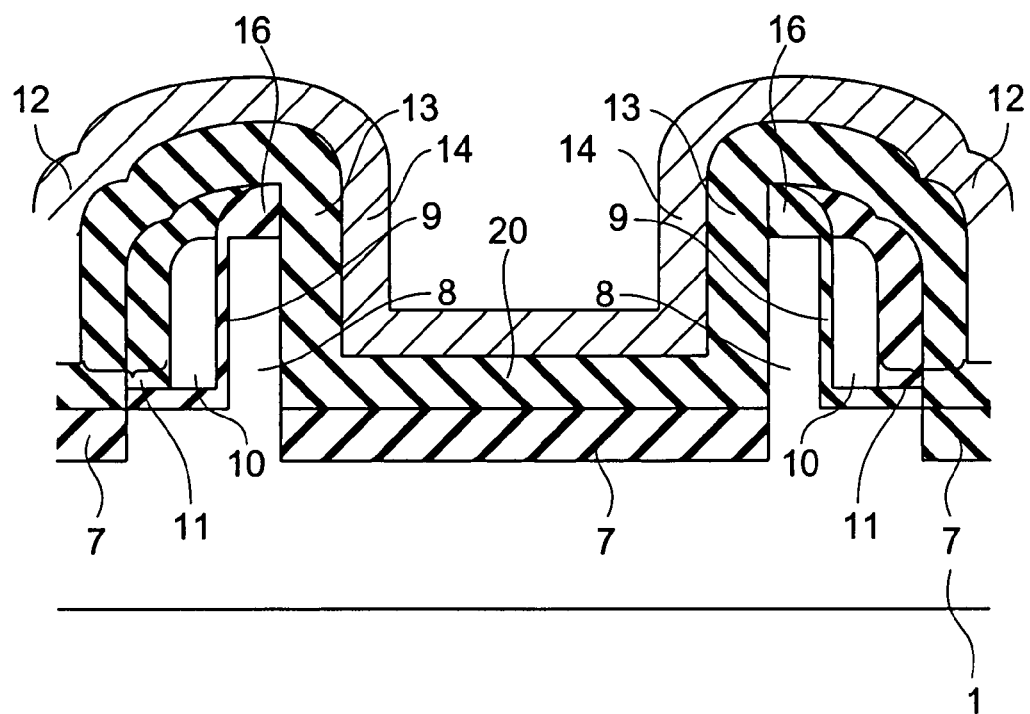

As shown in FIG. 9, a tungsten film of 100 nm in thickness, for example, is formed by CVD or the like on the entire surface of the semiconductor substrate 1 including the hafnium oxide film 20. RIE or the like is then performed, so that the tungsten film, the hafnium oxide film 20, the hafnium oxide sidewalls 19, the polycrystalline silicon sidewalls 18, the silicon oxide sidewalls 16 are processed to form first and second control gate electrodes 12 and 14 as an integrated unit in this embodiment, charge accumulating layers 10, second insulating films 11, and third insulating films 13. After the formation of the tungsten film, the surface of the tungsten film may be smoothed by the chemical mechanical polishing technique (hereinafter referred to as "CMP") or the like. As the surface is smoothed, the depth of focus required in the lithography (optical-etching) process does not need to be large. Here, the portions of the silicon oxide sidewalls 16 located on the plate-like semiconductor regions 8 are also removed.

Figure 10:
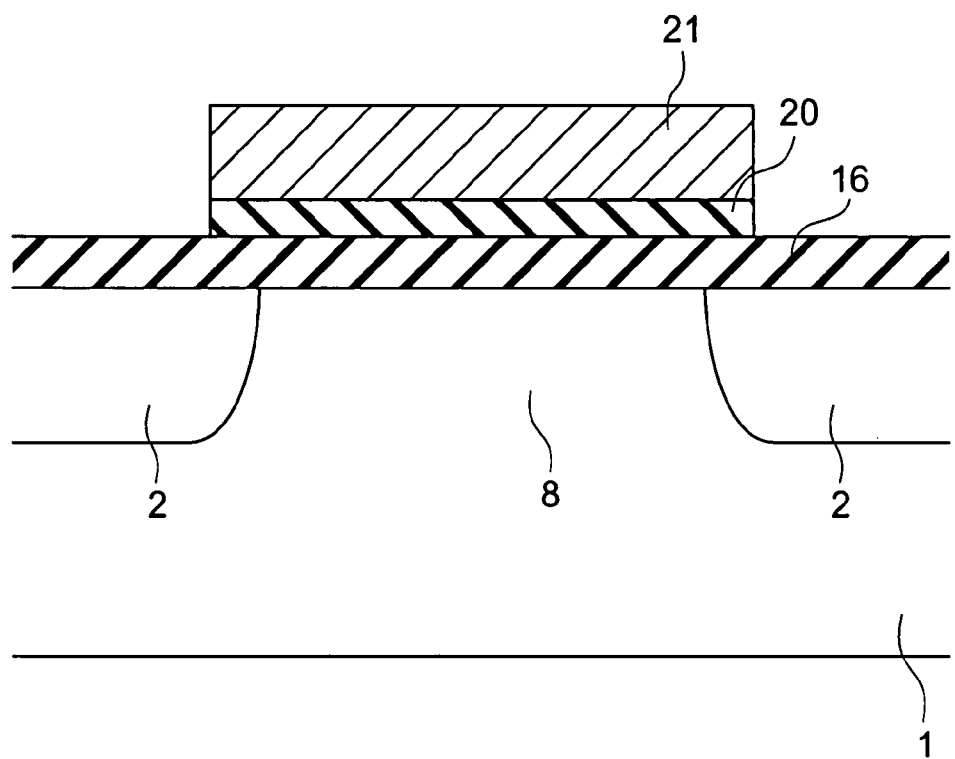

The procedure illustrated in FIG. 10 is then carried out. FIG. 10 is a cross-sectional view, taken along the line C-C' of FIG. 2. In this figure, the first and second control gate electrodes 12 and 14 integrally formed in this embodiment is shown as a control gate electrode 21. Here, As ions, for example, are injected with an energy of 5 keV and a concentration of $1\times10^{15}$ cm$^{-2}$, and heat treatment is carried out so as to form source/drain regions 2.

Thereafter, an interlayer insulating film forming procedure, a wiring procedure, and the likes are carried out so as to complete nonvolatile semiconductor memory elements of this embodiment as in a conventional case.

Although n-type nonvolatile semiconductor memory elements have been described in this embodiment, a p-type nonvolatile semiconductor memory element may have the same structure as an n-type nonvolatile semiconductor memory element of this embodiment when the conductivity type of the impurities is reversed, and this embodiment may be applied even to complementary semiconductor memory elements when impurities are introduced only into predetermined regions in the substrate by an optical etching technique or the like. Also, this embodiment may be applied to a semiconductor device that includes those semiconductor memory elements.

Although the procedures for forming nonvolatile semiconductor memory elements have been described in this embodiment, the same procedures as above may be carried out to form nonvolatile semiconductor memory elements as parts of a semiconductor device, including not only nonvolatile semiconductor memory elements, but also active elements such as field effect transistors, bipolar transistors, and single-electron transistors, passive elements such as resistors, diodes, inductors, and capacitors, elements including ferromagnetic materials, or elements including magnetic materials. The same procedures as above may also be carried out to form nonvolatile semiconductor memory elements as parts of OEICs (Opto-Electrical Integrated Circuits) or MEMSs (Micro-Electro-Mechanical Systems). It should be understood that those semiconductor devices may include the peripheral circuits of nonvolatile semiconductor memory elements.

Although each of the nonvolatile semiconductor memory elements of this embodiment described above is formed on a bulk substrate, the nonvolatile semiconductor memory elements of this embodiment may be formed on SOI substrates (Semiconductor on Insulator substrate), to achieve the same effects as above.

In this embodiment described above, As (arsenic) is used as the impurity for forming an n-type semiconductor layer, and B (boron) is used as the impurity for forming a p-type semiconductor layer. However, it is possible to use some other V-group impurity as the impurity for forming an n-type semiconductor layer, and to use some other III-group impurity as the impurity for forming a p-type semiconductor layer. Alternatively, a compound containing a III- or V-group impurity may be introduced into the structure.

Although the impurity introduction is carried out through ion implantation in this embodiment, some other techniques such as solid-phase diffusion or vapor-phase diffusion may be utilized. Alternatively, it is possible to deposit or grow a semiconductor containing impurities.

In this embodiment described above, impurity introduction is not performed for adjusting the threshold voltages of an element. However, it is possible to carry out impurity introduction for adjusting the threshold voltages, independently of the impurity introduction for the well formation. In this manner, desired threshold voltages can be readily set. This embodiment also has the advantage of simplifying the manufacturing procedures.

Although each element of this embodiment described above has a single drain structure, an element having some other structure such as an extension structure may be produced. Alternatively, an element having a halo structure or a pocket structure may be produced. Any of such structures is preferable, as higher resistance to short channeling effects can be achieved with any of such structures.

In this embodiment described above, the formation of the source/drain regions is carried out after the processing of the gate electrodes and the gate insulating films. However, this processing order is not essential, and those procedures may be carried out in reverse order. Depending on the material used for the gate electrodes and the gate insulating films, heat treatment is not preferable. In such a case, the impurity introduction into the source/drain regions and the heat treatment for activation should preferably be carried out prior to the processing of the gate electrodes and the gate insulating films.

Although polycrystalline silicon is used for the charge accumulating layer in this embodiment described above, it is possible to use a metal such as tungsten to form a charge accumulating layer. Alternatively, a charge accumulating layer may be formed with a semiconductor such as single-crystal silicon or amorphous silicon, a metal other than tungsten, a compound containing a metal, or stacked layers of those materials. The same applies to the control gate electrodes. If the control gate electrodes are formed with a metal or a compound containing a metal, the resistance of the control gate electrodes is lowered, and accordingly, higher operation speed of elements can be achieved, which is preferable. Also, since the control gate electrodes and the charge accumulating layer are formed with a metal, oxidization does not easily occur, and higher controllability can be achieved at the interface between the tunnel gate insulating film and the interpoly insulating film and the interface between the control gate electrodes and the charge accumulating layer. If a semiconductor such as polycrystalline silicon is used for at least a portion of the control gate electrodes and the charge accumulating layer, the work function can be readily controlled. This leads to the advantage that each threshold voltage can be readily adjusted. Alternatively, the charge accumulating layer may be formed with a metal or a semiconductor in granulous shape or a compound containing the metal or the semiconductor. A level existing in an insulating film or at an interface of a stacked insulating film may also be used as the charge accumulating layer.

In this embodiment described above, the control gate electrodes and the charge accumulating layer are formed by performing anisotropic etching after the materials for them are deposited. However, the control gate electrodes and the charge accumulating layer may be formed through an embedding process such as a damascene process. In a case where the source/drain regions are formed prior to the formation of the control gate electrodes and the charge accumulating layer, a damascene process is preferably used so that the source/drain regions, the control gate electrodes, and the charge accumulating layer are formed in a self-aligning fashion.

In this embodiment described above, the upper portion and the lower portion of each of the control gate electrodes have the same lengths, when measured in the principal direction of the current flowing in the element. However, this aspect of this embodiment is not essential. For example, each of the control gate electrodes may have a T-like shape, with the upper portion being longer than the lower portion. In such a case, the advantage of lowering the gate resistance can also be achieved.

Figure 11:
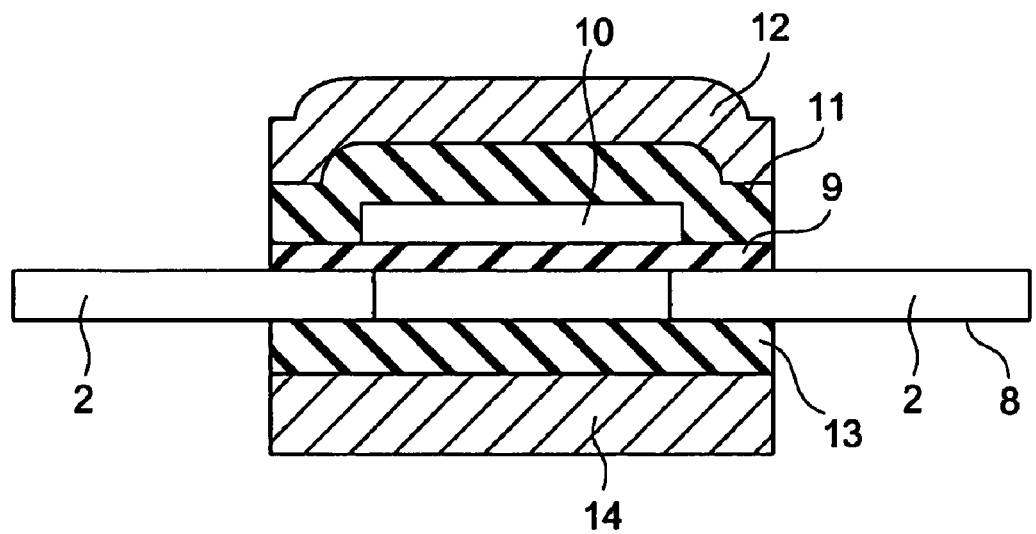
FIG. 11 is a cross-sectional view of a nonvolatile semiconductor memory element in accordance with a first modification of the first embodiment.

In this embodiment described above, the length of each control gate electrode and the length of the charge accumulating layer are the same, when measured in the principal direction of the current flowing in the element. However, this aspect of this embodiment is not essential, and the two lengths may be different. Particularly, in a case where the control gate electrodes are designed to be longer and to cover the charge accumulating layer as schematically shown in FIG. 11, which is a cross-sectional view showing the connection between the first control gate electrode and the second control gate electrode, the coupling ratio of the electrostatic capacitance formed between the charge accumulating layer and the control gate electrodes to the electrostatic capacitance formed between the charge accumulating layer and the channel region can be made higher. Accordingly, higher controllability can be achieved over the electric field in the tunnel insulating film formed by varying the potential of the control gate electrodes. Also, the two lengths are made equal to each other by the manufacturing method of this embodiment described above. In this manner, the control gate electrodes and the charge accumulating layer can be processed in a single masking procedure. Accordingly, the manufacturing can be simplified.

Figure 12:
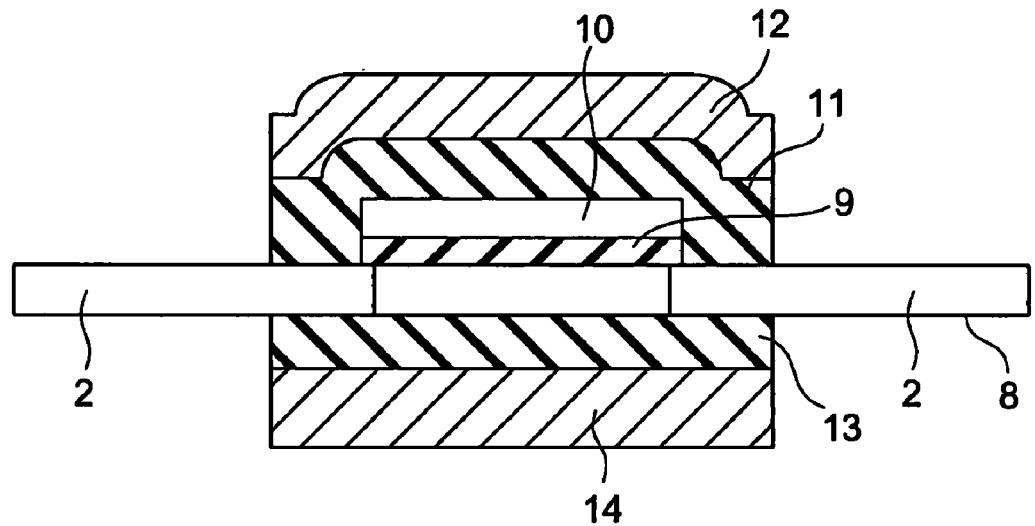
FIG. 12 is a cross-sectional view of a nonvolatile semiconductor memory element in accordance with a second modification of the first embodiment.

In FIG. 11, the first, second, and third insulating films 9, 11, and 13 have the same length as the control gate electrodes 12 and 14. However, this aspect is not essential, and those lengths may be different from each other. Also, the first insulating film 9 may be shorter than the control gate electrode 12, as shown in FIG. 12.

Although not clearly mentioned in this embodiment described above, metal layers as wiring layers may be formed by a sputtering technique or a deposition technique. Alternatively, such metal layers may be formed by a metal selective growth technique or a damascene process. The material for the wiring metal may be Al (aluminum) containing silicon, or a metal such as Cu (copper). Particularly, Cu is preferable, having lower resistivity.

Although a silicidation procedure is not mentioned in this embodiment, silicide layers may be formed on the source/ drain regions. Alternatively, layers containing a metal may be deposited or grown on the source/drain regions. This is preferable, as the resistance of the source/drain regions can be lowered. In a case where the control gate electrodes are formed with polycrystalline silicon, silicidation may be performed on the control gate electrodes. The silicidation is preferable, as the gate resistance can be lowered. Also, an elevated structure may be employed. An elevated structure is also preferable, as the resistance of the source/drain regions can be lowered.

In this embodiment described above, the electrodes are exposed through the upper portions of the control gate electrodes. However, it is possible to provide an insulator such as silicon oxide, silicon nitride, or silicon oxynitride, on the upper portions. Particularly, in a case where the control gate electrodes are formed with materials containing a metal, and silicide layers are formed on the source/drain regions, a protecting material such as silicon oxide, silicon nitride, or silicon oxynitride needs to be provided on the upper portions of the control gate electrodes, if the control gate electrodes need to be protected during the manufacturing.

In this embodiment described above, a silicon oxide film formed through thermal oxidization is formed as the tunnel gate insulating film. However, the tunnel gate insulating film may be an insulating film such as a silicon oxynitride film or an insulating film formed with stacked silicon oxynitride films. The existence of nitrogen in an insulating film is preferable, as impurity diffusion in the substrate is restrained in a case where polycrystalline silicon containing impurities is used for the control gate electrodes and the charge accumulating layer resulting in that threshold voltage can be prevented from varying. On the other hand, if silicon oxide is used, the current driving force of the element is increased, as the interface level at the interface between the tunnel gate insulating film and the channel region and the fixed charge amount in the insulating film are small. The formation of the insulating film is not limited to thermal oxidization, but some other technique, such as a deposition technique such as CVD, a vapor deposition technique, a sputtering technique, or an epitaxial growth technique may be utilized. In a case where an oxide of some material is used for the insulating film, a film made of the material may be formed first, and oxidization may be then performed on the film. Alternatively, such a film may be left in an oxygen gas in an excited state that does not involve a temperature rise. Leaving the film in an oxygen gas in an excited state not involving a temperature rise is preferable, as the impurity concentration distribution can be prevented from varying due to impurity diffusion in the channel region. In a case where silicon oxynitride is used, a silicon oxide film is formed first, and the silicon oxide film is then left in a gas containing nitrogen in a temperature rising state or an excited state, so as to introduce nitrogen into the insulating film. Leaving the film in a nitrogen gas in an excited state not involving a temperature rise is preferable, as the impurity concentration distribution can be prevented from varying due to impurity diffusion in the channel region. Alternatively, a silicon nitride film may be formed first, and the silicon nitride film is then left in a gas containing oxygen in a temperature rising state or an excited state, so as to introduce oxygen into the insulating film. Leaving the film in an oxygen gas in an excited state not involving a temperature rise is preferable, as the impurity concentration distribution can be prevented from varying due to impurity diffusion in the channel region.

In this embodiment described above, a hafnium oxide film formed through deposition is used as the interpoly insulating film. However, the interpoly insulating film may be an insulating film that is made of an oxide of a metal such as Zr (zirconium), Ti (titanium), Sc (scandium), Y (yttrium), Ta (tantalum), Al, La (lanthanum), Ce (cerium), Pr (praseodymium), or an element of the lanthanoid series, a silicate material containing various elements such as the above elements, a material containing nitrogen as well as the above elements, or a high-dielectric film, or an insulating film that is formed with stacked layers made of the above elements. It is also possible to use an insulating film made of silicon oxide, silicon nitride, or silicon oxynitride. The existence of nitrogen in the insulating film is preferable, as crystallization and precipitation of only a certain element can be prevented. The existence of nitrogen in the insulating film is also preferable, as each threshold voltage can be prevented from varying because impurity diffusion in the substrate is restrained in a case where polycrystalline silicon containing impurities is used for the gate electrodes. The formation of the insulating film is not limited to a deposition technique such as CVD, but some other technique, such as a vapor deposition technique, a sputtering technique, or an epitaxial growth technique may be utilized. In a case where an oxide of some material is used for the insulating film, a film made of the material may be formed first, and oxidization may be then performed on the film.

The thicknesses of the insulating films forming such as the tunnel gate insulating film and the interpoly insulating film are not limited to the values set in this embodiment. Since the strength of capacitive coupling is determined not by the geometric film thicknesses but by the equivalent oxide thicknesses, the coupling ratio of electrostatic capacitance can be made advantageously higher by making the equivalent oxide thickness of the interpoly insulating film smaller than the equivalent oxide thickness of the tunnel gate insulating film. Particularly, if the interpoly insulating film is made of a material with a higher dielectric constant than that of the tunnel gate insulating film, the geometric film thickness of the interpoly insulating film can be maintained at a large value, while the equivalent oxide thickness of the interpoly insulating film is made smaller. Accordingly, the coupling ratio of electrostatic capacitance becomes higher, and the current flowing through the interpoly insulating film can be advantageously restrained.

Although gate sidewalls are not mentioned in this embodiment described above, sidewalls may be provided for the control gate electrodes and the charge accumulating layer. Particularly, in a case where the interpoly insulating film and the tunnel gate insulating film are made of materials with high dielectric constants, the electric fields at the portions of the interpoly insulating film and the tunnel gate insulating film located in the vicinities of the lower end corners of the control gate electrodes and the charge accumulating layer can be weakened by providing gate sidewalls made of materials with high dielectric constants, as disclosed in Japanese Patent Publication No. 3658564. Accordingly, such gate sidewalls are preferable, as the reliability of the interpoly insulating film and the tunnel gate insulating film can be increased, and excess erasing can be prevented.

Although post oxidization to be performed after the formation of the control gate electrodes and the charge accumulating layer is not mentioned in this embodiment described above, a post-oxidization procedure may be carried out, if possible, with the materials of the control gate electrodes, the charge accumulating layer, and the gate insulating film being taken into consideration. The angled portions of the lower ends of the control gate electrodes and the charge accumulating layer may be rounded not only through post oxidization but also by leaving those electrodes and layer in a chemical solution or a reactive gas. If one of those procedures is possible, the electric fields in the lower end corners of the control gate electrodes and the charge accumulating layer can be weakened. Accordingly, the reliability of the tunnel gate insulating film and the interpoly insulating film can be increased, which is preferable.

Although not clearly mentioned in this embodiment described above, a silicon oxide film may be employed as the interlayer insulating film, or some other material such as a material with a low dielectric constant may be used for the interlayer insulating film. As the dielectric constant of the interlayer insulating film is lowered, the parasitic capacitance of the element is reduced. Accordingly, the advantage of high-speed operations can be achieved for the element.

Although contact holes have not been described, it is also possible to form self-aligning contact holes. Self-aligning contact holes are preferable, as the area of the element can be made smaller, and higher integration can be achieved.

By the manufacturing method in accordance with this embodiment, two nonvolatile semiconductor memory elements are formed at the same time. However, more than or less than two nonvolatile semiconductor memory elements may be formed at the same time in this embodiment, to achieve the same effects as above.

As described so far, this embodiment can provide high-performance nonvolatile semiconductor memory elements that have high controllability over the threshold voltages, restrain variations of the threshold voltages, and can have more than two threshold voltages while lowering the power supply voltage.

Second Embodiment

Figure 13:
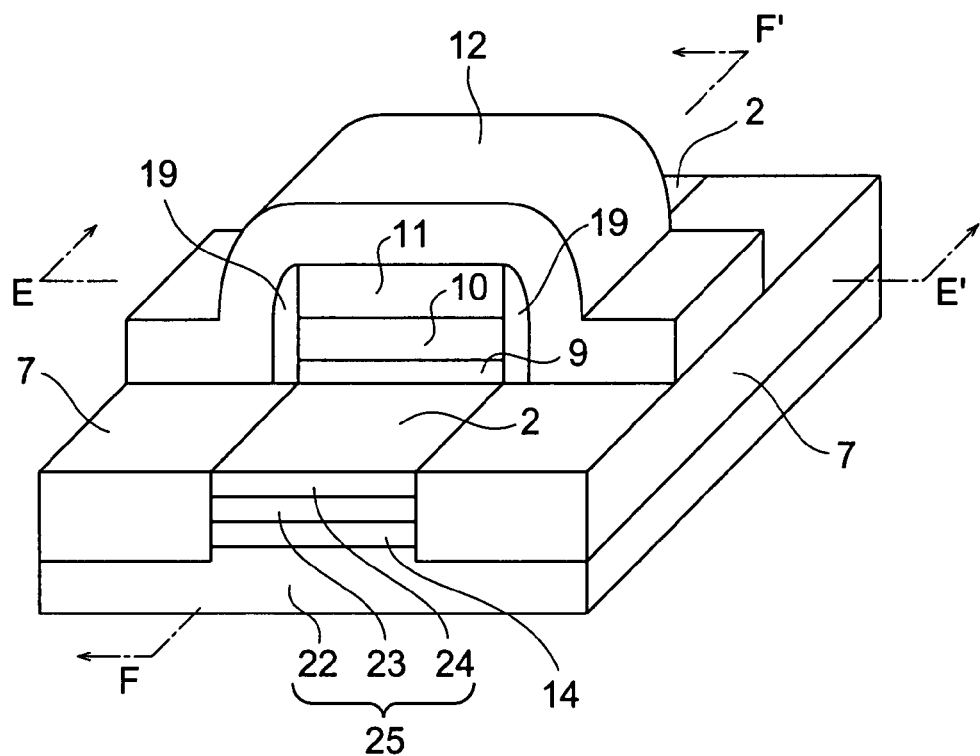
FIG. 13 is a perspective view of a nonvolatile semiconductor memory element in accordance with a second embodiment of the present invention.
Figure 14:
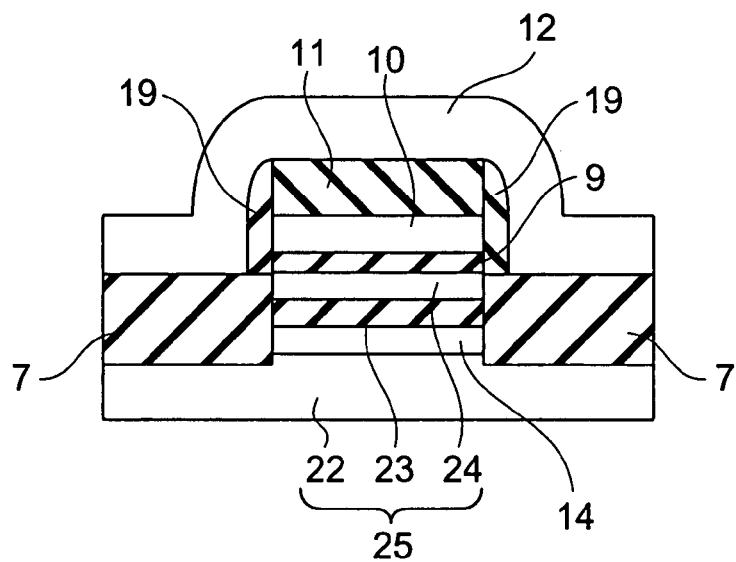
FIGS. 14 through 15 are cross-sectional views showing the nonvolatile semiconductor memory element of the second embodiment.
Figure 15:
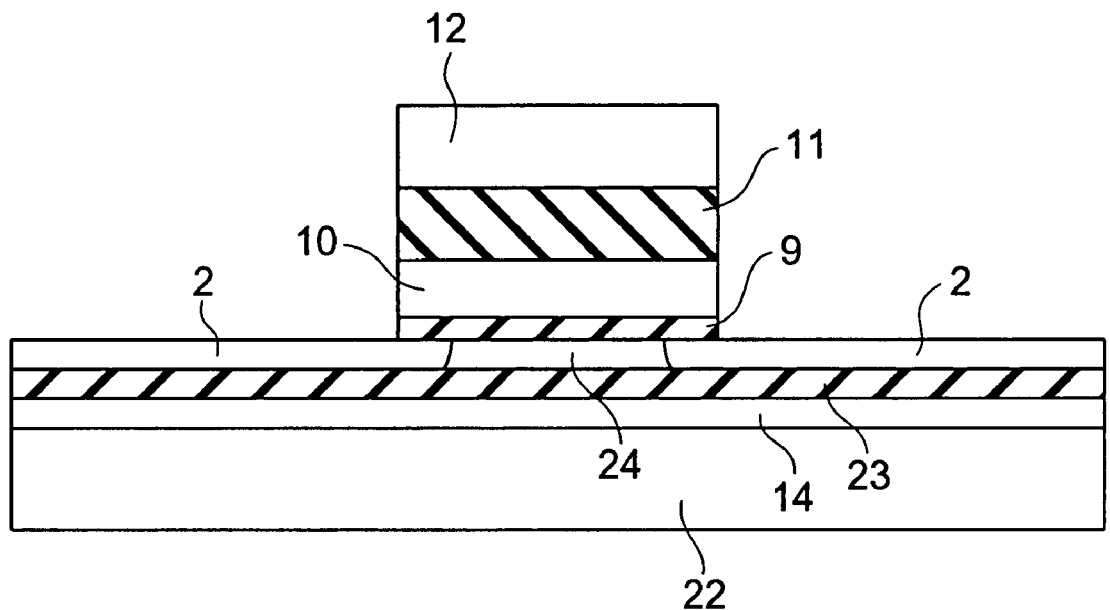

FIG. 13 is a schematic view of a nonvolatile semiconductor memory element in accordance with a second embodiment of the present invention. FIG. 14 is a cross-sectional view of the nonvolatile semiconductor memory element, taken along the line E-E' of FIG. 13. FIG. 15 is a cross-sectional view of the nonvolatile semiconductor memory element, taken along the line F-F' of FIG. 13.

The nonvolatile semiconductor memory element of this embodiment is formed on a SOI substrate 25 having a semiconductor layer 24 formed on a supporting semiconductor substrate 22, with an embedded insulating film 23 being interposed in between. The channel region of the element is formed in the semiconductor layer 24 located between device isolating regions 7. A charge accumulating layer 10 is formed on the channel region, with a first insulating film 9 being interposed in between. A second insulating film 11 is formed on the charge accumulating layer 10. Sidewalls 19 are provided for the stack structure formed with the first insulating film 9, the charge accumulating layer 10, and the second insulating film 11. A first control gate electrode 12 is formed so as to cover the stack structure and the sidewalls 19. In the semiconductor layer 24, source/drain regions 2 are formed so as to sandwich the charge accumulating layer and have an overlapping portion. The embedded insulating film 23 functions as a third insulating film, and an impurity diffusion layer formed in the supporting semiconductor substrate 22 serves as a second control gate electrode 14. In FIGS. 13 through 15, the interlayer insulating film, the wiring metals, and the likes are not shown.

Figure 16:
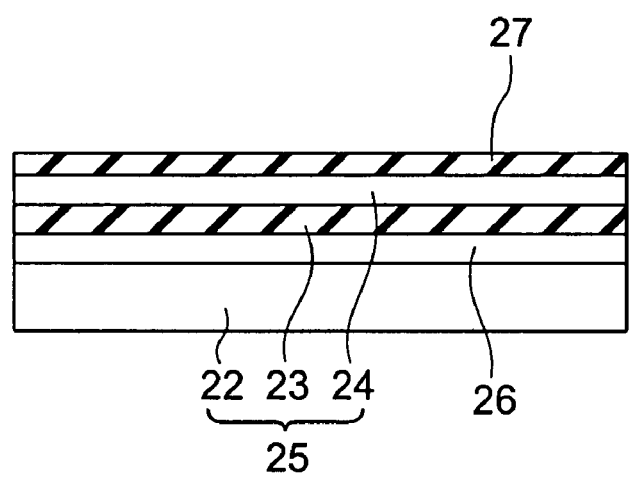
FIGS. 16 through 19 are cross-sectional views showing the procedures for manufacturing the nonvolatile semiconductor memory element of the second embodiment.
Figure 17:
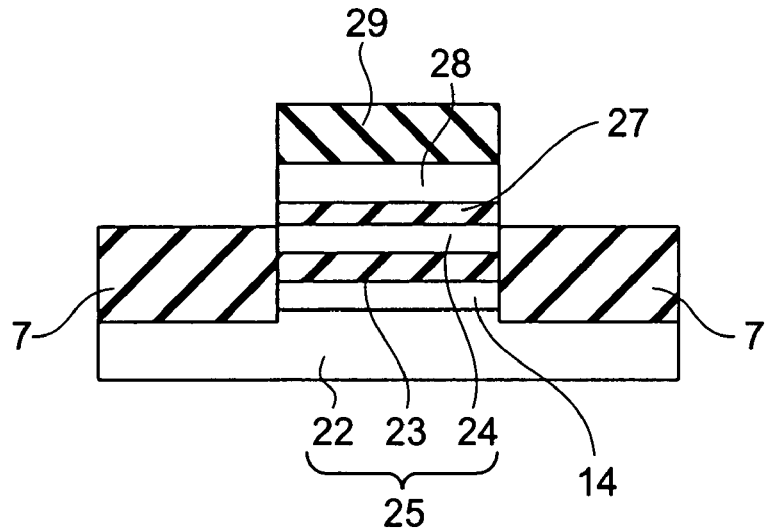
Figure 18:
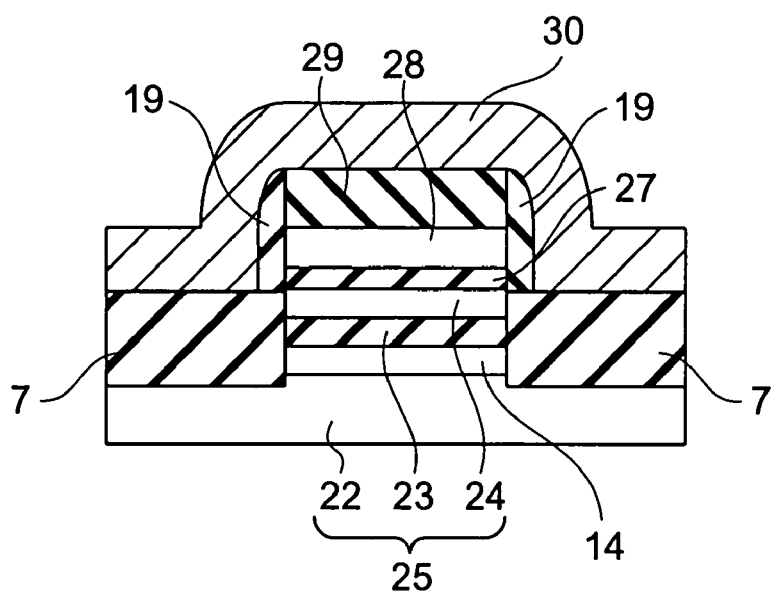

Next, a method for manufacturing a nonvolatile semiconductor memory element of this embodiment is described. Here, an n-type nonvolatile semiconductor memory element is to be produced. This method can also be utilized to produce a p-type nonvolatile semiconductor memory element, if the conductivity type of the impurity is reversed. FIGS. 16 through 18 are cross-sectional views, taken along the line E-E' of FIG. 13.

First, the procedure shown in FIG. 16 is carried out. The supporting semiconductor substrate 22 of the SOI substrate 25 contains a III-group impurity. For example, As ions are injected into the supporting semiconductor substrate 22, with an energy of 50 keV and a concentration of $5 \times 10^{15}$ cm$^{-2}$. B ions are then injected into the semiconductor layer 24, with an energy of 10 keV and a concentration of $1 \times 10^{12}$ cm$^{-2}$, for example. Heat treatment is then carried out at 1050° C. for 30 seconds. In this manner, an n-type semiconductor layer 26 is formed in the supporting semiconductor substrate 22. The semiconductor layer 24 is oxidized through thermal oxidization or the like, so as to form a silicon oxide film 27.

As shown in FIG. 17, a 20-nm thick polycrystalline silicon film 28 containing As, for example, is formed on the silicon oxide film 27 by CVD or the like, and a 10-nm thick hafnium oxide film 29 is formed on the polycrystalline silicon film 28 by CVD or the like. RIE or the like is then performed to process the hafnium oxide film 29, the polycrystalline silicon film 28, the silicon oxide film 27, the semiconductor layer 24, and the embedded insulating film 23, and to form grooves in the supporting semiconductor substrate 22. The grooves are then filled with silicon oxide or the like, so as to form device isolating regions 7. In this manner, the n-type semiconductor layer 26 is processed so as to form the second control gate electrode 14. In the nonvolatile semiconductor memory element of this embodiment, the embedded insulating film 23 functions as the third insulating film 13.

As shown in FIG. 18, a 10-nm thick hafnium oxide film is formed by CVD or the like, and the hafnium oxide film is processed by RIE or the like, so as to form the hafnium oxide sidewalls 19. A 100-nm thick tungsten film 30, for example, is then formed by CVD or the like. After the formation of the tungsten film 30, the surface of the tungsten film 30 may be smoothed by CMP or the like. The smoothed surface has the advantage that the depth of focus required in the lithography (optical etching) process does not need to be large.

Figure 19:
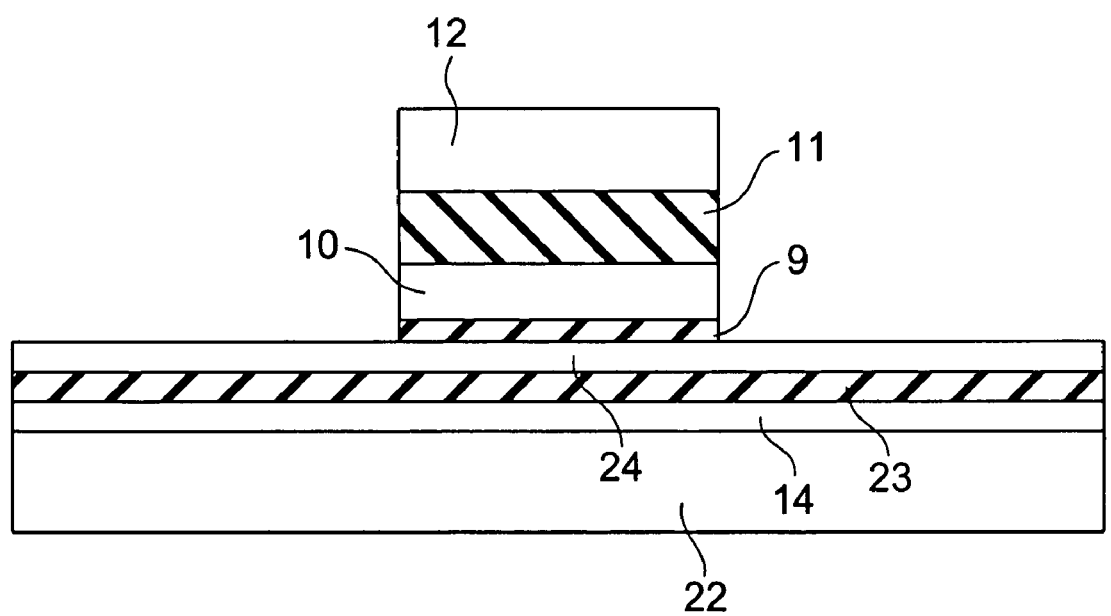

The procedure shown in FIG. 19 is then carried out. FIG. 19 is a cross-sectional view, taken along the line F-F' of FIG. 13. RIE or the like is performed to process the tungsten film 30, the hafnium oxide film 29, the polycrystalline silicon film 28, the silicon oxide film 27, and the hafnium oxide sidewalls 19. In this manner, the first control gate electrode 12, the second insulating film 11, the charge accumulating layer 10, and the first insulating film 9 are formed.

As ions are then injected with an energy of 5 keV and a concentration of $1 \times 10^{15}$ cm$^{-2}$, and heat treatment is carried out to form the source/drain regions 2.

Thereafter, the interlayer insulating film forming procedure, the wiring procedure, and the likes are carried out, as in a conventional case. Thus, a nonvolatile semiconductor memory element of this embodiment is completed.

As in the first embodiment, the thickness of the semiconductor layer 24 should preferably be equal to or smaller than twice the largest thickness a depletion layer can have depending on the impurity concentration in the semiconductor layer 24 in this embodiment.

Also as in the first embodiment, the sum of the equivalent oxide thickness of the first insulating film 9 and the equivalent oxide thickness of the second insulating film 11 should preferably be equal to or greater than the equivalent oxide thickness of the embedded insulating film 23 in this embodiment.

As in the first embodiment, the dielectric constant of the embedded insulating film 23 should preferably be equal to or higher than the dielectric constant of the first insulating film 9 in this embodiment.

As in the first embodiment, the equivalent oxide thickness of the first insulating film 9 should preferably be equal to or greater than the equivalent oxide thickness of the second insulating film 11 in this embodiment.

As in the first embodiment, the dielectric constant of the second insulating film 11 should preferably be equal to or higher than the dielectric constant of the first insulating film 9 in this embodiment.

In this embodiment, the second control gate electrode 14 is located on the semiconductor supporting substrate 22 which is located below the source/drain regions 2 and the semiconductor layer forming the channel between the source/drain regions 2. The second control gate electrode 14 and the source/drain regions 2 are designed to have the same lengths as each other in the extending direction of the first control gate electrode 12 that is perpendicular to the second control gate electrode 14. Accordingly, the source/drain regions 2 are formed in a self-aligning fashion with respect to the second control gate electrode 14. When nonvolatile semiconductor memory elements of this embodiment are formed, the elements can be formed in cycles twice the cycles of the minimum process size both in the direction of the line E-E' and in the direction of the line F-F' of FIG. 13. Thus, the area of each one element can be four times as large as the square of the smallest process size. As a result, higher integration can be achieved.

On the other hand, each nonvolatile semiconductor memory element of the first embodiment has the advantage of a simplified circuit structure, as the first control gate electrode and the second control gate electrode can be integrated.

As described so far, this embodiment can provide high-performance nonvolatile semiconductor memory elements that have high controllability over the threshold voltages, restrain variations of the threshold voltages, and can have more than two threshold voltages while lowering the power supply voltage.

The various modifications as described in the first embodiment may be made to this embodiment, and the same effects as above can be achieved.

Third Embodiment

Next, a nonvolatile semiconductor memory device in accordance with a third embodiment of the present invention is described.

Figure 20:
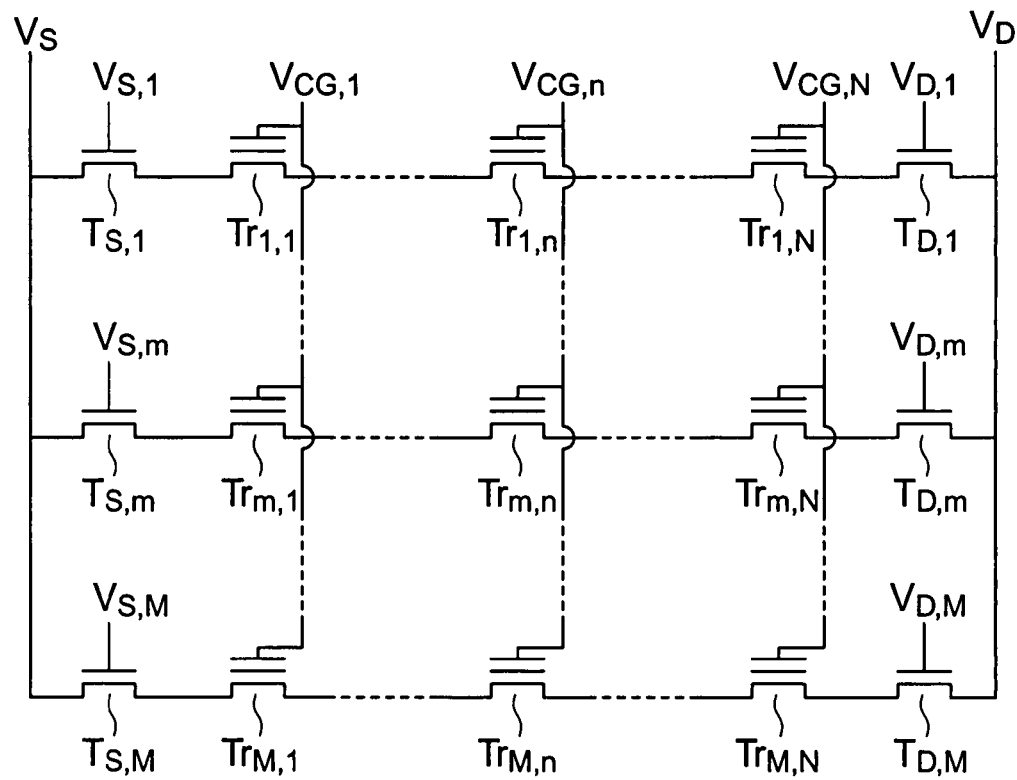
FIG. 20 is a circuit diagram of a nonvolatile semiconductor memory device in accordance with a third embodiment of the present invention.
Figure 21:
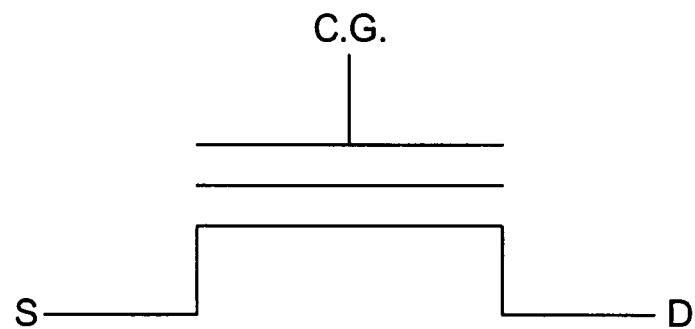
FIG. 21 is a diagram for explaining the graphic representation of each nonvolatile semiconductor memory element of the first embodiment in a circuit diagram.

FIG. 20 is a circuit diagram of the nonvolatile semiconductor memory device of this embodiment. This nonvolatile semiconductor memory device has nonvolatile semiconductor memory elements of the first embodiment arranged at lattice points. In FIG. 20, each of the nonvolatile semiconductor memory elements of the first embodiment is represented by the diagram shown in FIG. 21. In FIG. 21, the terminals denoted by S and D are the source and drain, respectively, and the terminal denoted by C.G. is the first and second control gate electrodes that are integrally formed. The terminal of the substrate is not shown. In FIG. 20, each of the nonvolatile semiconductor memory elements of the first embodiment is denoted by $Tr_{i,j}$ ($1 \leq i \leq M$, $1 \leq j \leq N$).

In the nonvolatile semiconductor memory elements arranged in the same row, the plate-like semiconductor regions forming the channels are joined to one another, and the source/drain regions of each two neighboring elements are connected. In the nonvolatile semiconductor memory elements arranged in the same column, the control gate electrodes are connected to one another (since the first and second control gate electrodes of each nonvolatile semiconductor memory element of the first embodiment are integrally formed, the two control gate electrodes are referred to collectively as the "control gate electrode" in this embodiment). The combined plate-like semiconductor region of each row is connected to common lines via field effect transistors $T_{S,i}$ and $T_{D,i}$ ($1 \leq i \leq M$) at both left and right ends. The potentials of the common lines are $V_S$ and $V_D$, respectively. The potentials of the gate electrodes of the field effect transistors $T_{S,i}$ and $T_{D,i}$ ($1 \leq i \leq M$) are $V_{S,i}$ and $V_{D,i}$ ($1 \leq i \leq M$), respectively. The threshold voltages of the field effect transistors $T_{S,i}$ and $T_{D,i}$ ($1 \leq i \leq M$) are substantially the same at $V_{th}$, though not necessarily being exactly equal to each other. The threshold voltage $V_{th}$ is set between zero and $V_{DD}$. The potentials of the control gate electrodes connected to one another in the jth column are $V_{CG,j}$ ($1 \leq j \leq N$). The substrate potentials of all the nonvolatile semiconductor memory elements $Tr_{i,j}$ ($1 \leq i \leq M$, $1 \leq j \leq N$) are the same. The wirings provided outside the area shown in FIG. 20 and the connection areas with the external wirings or the likes are not shown in FIG. 20. The nonvolatile semiconductor memory device of this embodiment can store L×M×N bits of information in total. Here, L represents the number of bits each one nonvolatile semiconductor memory element can store. The operations of this nonvolatile semiconductor memory element are described below.

The nonvolatile semiconductor memory element of this embodiment is of the n-type, and information writing, erasing, and reading to be performed on the nonvolatile semiconductor memory element $Tr_{m,n}$ (the nonvolatile semiconductor memory element located in the m-th row and in the n-th column) are described below. A p-type nonvolatile semiconductor memory element performs the same operations as those described below, if the voltage polarities are reversed.

First, information writing is performed as follows. As in the first embodiment, the nonvolatile semiconductor memory elements can have various threshold voltages, which are $V_{TH,1}$, $V_{TH,2}$, ..., $V_{TH,L}$ in the ascending order. Here, $V_{TH,k}$ ($2 \leq k \leq L-1$) are set between zero and $V_{DD}$. The common substrate potential is set at zero.

The potential $V_{CG,j}$ ($1 \leq j \leq N$) is set higher than $V_{TH,L}$, but does not cause electron injection into the charge accumulating layer. With this arrangement, all the nonvolatile semiconductor memory elements $Tr_{i,j}$ ($1 \leq i \leq M$, $1 \leq j \leq N$) are put into a conductive state.

Meanwhile, the potentials $V_{S,i}$ and $V_{D,i}$ ($i \neq m$) are set at a value (such as zero) lower than $V_{th}$, and the potentials $V_{S,m}$ and $V_{D,m}$ are set at a value (such as $V_{DD}$) higher than $V_{th}$. With this arrangement, the field effect transistors $T_{S,i}$ and $T_{D,i}$ ($i \neq m$) are all put into a nonconducting state, while the field effect transistors $T_{S,m}$ and $T_{D,m}$ are put into a conductive state.

The potentials $V_S$ and $V_D$ are set at zero. By doing so, the source/drain regions of the nonvolatile semiconductor memory elements $Tr_{i,j}$ ($i \neq m$, $1 \leq j \leq N$) are put into a floating state, as being not connected to an external circuit. The potentials of the source/drain regions of the nonvolatile semiconductor memory elements $Tr_{m,j}$ ($1 \leq j \leq N$) become zero, as being connected to an external circuit. As a result of this, the potentials of the channel regions of the nonvolatile semiconductor memory elements $Tr_{m,j}$ ($1 \leq j \leq N$) also become zero. Under these circumstances, the common substrate is put into a floating state, and the potential $V_{CG,n}$ is set at such a potential that causes electron injection into the charge accumulating layer so as to set the threshold voltage of the nonvolatile semiconductor memory element $Tr_{m,n}$ at a desired value. With this arrangement, charge injection into the charge accumulating layer of the nonvolatile semiconductor memory element $Tr_{m,n}$ is caused, and the threshold voltage of the nonvolatile semiconductor memory element $Tr_{m,n}$ can be adjusted to the desired value.

The potential $V_{CG,j}$ (j≠n) is set higher than $V_{TH,L}$, but does not cause electron injection into a charge accumulating layer. Accordingly, neither charge injection into the charge accumulating layers of the nonvolatile semiconductor memory elements $Tr_{i,j}$ (1≦i≦M, j≠n) nor charge release from the charge accumulating layers of the nonvolatile semiconductor memory elements $Tr_{i,j}$ (1≦i≦M, j≠n) is caused. Hence, the threshold voltages of the nonvolatile semiconductor memory elements $Tr_{i,j}$ (1≦i≦M, j≠n) do not change. As described above, the source/drain regions of the nonvolatile semiconductor memory elements $Tr_{i,n}$ (i≠m) are in a floating state, and the substrate is also in a floating state. Therefore, when the potential $V_{CG,n}$ is changed, the potentials of the channel regions of the nonvolatile semiconductor memory elements $Tr_{i,n}$ (i≠m) follow the change in the potential $V_{CG,n}$, because of the capacitive coupling with the control gate electrodes via the first insulating films, the charge accumulating layers, and the second insulating films. Accordingly, the electric field in each of the first insulating films of the nonvolatile semiconductor memory elements $Tr_{i,n}$ (i≠m) does not have a very high value, and charge injection into the charge accumulating layers is not caused. As a result, the threshold voltages of the nonvolatile semiconductor memory elements $Tr_{i,n}$ (i≠m) do not change. In this manner, only the threshold voltage of the nonvolatile semiconductor memory element $Tr_{m,n}$ can be controlled, without a change in the threshold voltages of the other nonvolatile semiconductor memory elements $Tr_{i,j}$ ((i,j)≠(m, n)). Thus, writing is performed.

Next, information erasing is described. Information erasing is performed simultaneously on the nonvolatile semiconductor memory elements arranged in the same column. Here, information erasing performed on the nonvolatile semiconductor memory elements of the nth column is described. The common substrate potential is set at zero. The potentials $V_{S,i}$ and $V_{D,i}$ (1≦i≦M) are set at a value (such as zero) lower than $V_{th}$, and the potential $V_{CG,j}$ (j≠n) is also set at a value (such zero) lower than $V_{th}$. The potential $V_{CG,n}$ is set at a sufficiently low potential, so that electrons are released from the corresponding charge accumulating layers. With this arrangement, the nonvolatile semiconductor memory elements $Tr_{i,j}$ (1≦i≦M, j≠n) are all put into a nonconducting state. As a result, the source/drain regions are put into a floating state, and the potentials of the channel regions become the same as the potential of the substrate, which is zero. Accordingly, electrons are not released from the charge accumulating layers of the nonvolatile semiconductor memory elements $Tr_{i,j}$ (1≦i≦M, j≠n), while electrons are released from the charge accumulating layers of the nonvolatile semiconductor memory elements $Tr_{i,n}$ (1≦i≦M). In this manner, only the information in the nonvolatile semiconductor memory elements $Tr_{i,n}$ (1≦i≦M) is erased, while the information in the nonvolatile semiconductor memory elements $Tr_{i,j}$ (1≦i≦M, j≠n) remains unchanged.

Simultaneous information erasing can be performed on all the nonvolatile semiconductor memory elements $Tr_{i,j}$ (1≦i≦M, 1≦j≦N) shown in FIG. 20 by setting the potentials $V_{S,i}$ and $V_{D,i}$ (1≦i≦M) and the potential $V_{CG,j}$ (1≦j≦N) at a value (such as zero) lower than $V_{th}$, and applying a sufficiently high potential to the common substrate so as to cause electron release from the charge accumulating layers. By doing so, all the information stored in the nonvolatile semiconductor memory elements $Tr_{i,j}$ (1≦i≦M, 1≦j≦N) can be simultaneously erased. Accordingly, the operation is simplified, and the time required for erasing is shortened.

On the other hand, the selective erasing described earlier has the advantage that the information stored in the nonvolatile semiconductor memory elements arranged in a certain column can be selectively erased, without a change in the information stored in the nonvolatile semiconductor memory elements arranged in the other columns.

Writing and erasing are performed as described above.

Next, reading is described. Reading information from the nonvolatile semiconductor memory element $Tr_{m,n}$ is performed as follows. The common substrate potential is set at zero. The potential $V_{CG,j}$ (j≠n) is set higher than $V_{TH,L}$. With this arrangement, the nonvolatile semiconductor memory elements $Tr_{i,j}$ (1≦i≦M, j≠n) are all put into a conductive state. The potential $V_S$ is set at zero, and the potential $V_D$ is set at $V_{DD}$, for example. The potentials $V_{S,i}$ and $V_{D,i}$ (i≠m) are set at a value (such as zero) lower than $V_{th}$, and the potentials $V_{S,m}$ and $V_{D,m}$ are set at $V_{DD}$, for example. With this arrangement, the field effect transistors $T_{S,i}$ and $T_{D,i}$ (i≠m) are all put into a nonconducting state, while the field effect transistors $T_{S,m}$ and $T_{D,m}$ are put into a conductive state. Here, the source/drain regions of the nonvolatile semiconductor memory elements $Tr_{i,j}$ (i≠m, 1≦j≦N) are put into a floating state, as being not connected to an external circuit. Since the source/drain regions of the nonvolatile semiconductor memory elements $Tr_{m,j}$ (1≦j≦N) are connected to an external circuit, the potentials of the source/drain regions of the nonvolatile semiconductor memory elements $Tr_{m,j}$ (1≦j<n) and the potential of the portion of the source/drain regions of the nonvolatile semiconductor memory element $Tr_{m,n}$ located at the left side of FIG. 20 become zero, while the potentials of the source/drain regions of the nonvolatile semiconductor memory elements $Tr_{m,j}$ (n<j≦N) and the potential of the portion of the source/drain regions of the nonvolatile semiconductor memory element $Tr_{m,n}$ located at the right side of FIG. 20 become $V_{DD}$. When the potential $V_{CG,n}$ is set at $V_{DD}$, for example, a current corresponding to the threshold voltage of the nonvolatile semiconductor memory element $Tr_{m,n}$ flows from the terminal having the potential $V_D$ applied thereto to the terminal having the potential $V_S$ applied thereto. Accordingly, the information stored in the nonvolatile semiconductor memory element $Tr_{m,n}$ can be read out by detecting the current. Alternatively, the potential $V_{CG,n}$ is set at $V_{DD}/2$, for example, and a current flowing from the terminal having the potential $V_D$ applied thereto to the terminal having the potential $V_S$ applied thereto is detected, so as to determine whether the threshold voltage of the nonvolatile semiconductor memory element $Tr_{m,n}$ is higher or lower than $V_{DD}/2$. If the threshold voltage of the nonvolatile semiconductor memory element $Tr_{m,n}$ is determined to be higher than $V_{DD}/2$, the potential $V_{CG,n}$ is set at $3 \times V_{DD}/4$, for example, and a current flowing from the terminal having the potential $V_D$ applied thereto to the terminal having the potential $V_S$ applied thereto is detected, so as to determine whether the threshold voltage of the nonvolatile semiconductor memory element $Tr_{m,n}$ is higher or lower than $3 \times V_{DD}/4$. If the threshold voltage of the nonvolatile semiconductor memory element $Tr_{m,n}$ is determined to be lower than $V_{DD}/2$, the potential $V_{CG,n}$ is set at $V_{DD}/4$, for example, and a current flowing from the terminal having the potential $V_D$ applied thereto to the terminal having the potential $V_S$ applied thereto is detected, so as to determine whether the threshold voltage of the nonvolatile semiconductor memory element $Tr_{m,n}$ is higher or lower than $V_{DD}/4$. The threshold voltage of the nonvolatile semiconductor memory element $Tr_{m,n}$ can be determined by repeating those procedures. The former method has the advantage of reading out the information stored in the nonvolatile semiconductor memory element $Tr_{m,n}$ through one procedure. The latter method has the advantage that the detection can be performed after amplification by a sense amplifier or the like, and a read error can be avoided, since each procedure only involves determining whether a current is flowing.

In this manner, each of the nonvolatile semiconductor memory elements can store L bits of information, and the nonvolatile semiconductor memory device can store L×M×N bits of information in total.

As described so far, this embodiment can provide a high-performance nonvolatile semiconductor memory device that has high controllability over the threshold voltages, restrains variations of the threshold voltages, and can have more than two threshold voltages while lowering the power supply voltage.

The various modifications as described in the foregoing embodiments may also be made to this embodiment, and the same effects as above can be achieved.

Fourth Embodiment

Next, a nonvolatile semiconductor memory device in accordance with a fourth embodiment of the present invention is described.

Figure 22:
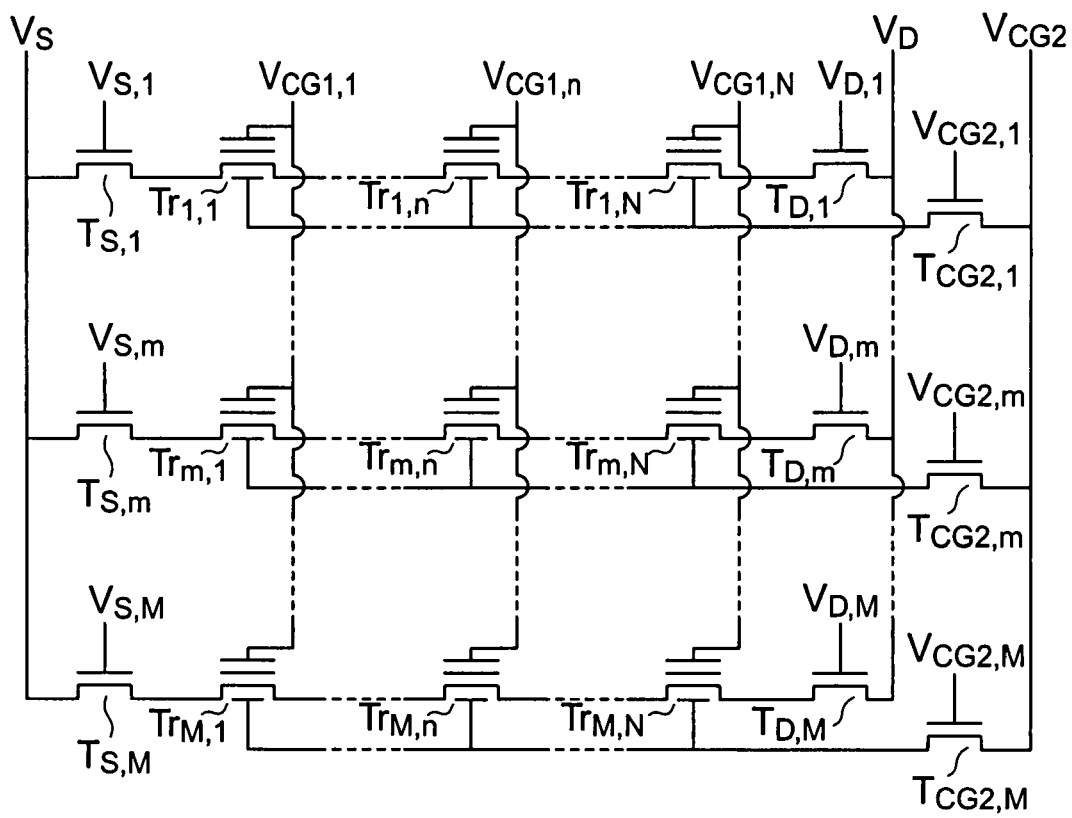
FIG. 22 is a circuit diagram of a nonvolatile semiconductor memory device in accordance with a fourth embodiment of the present invention.
Figure 23:
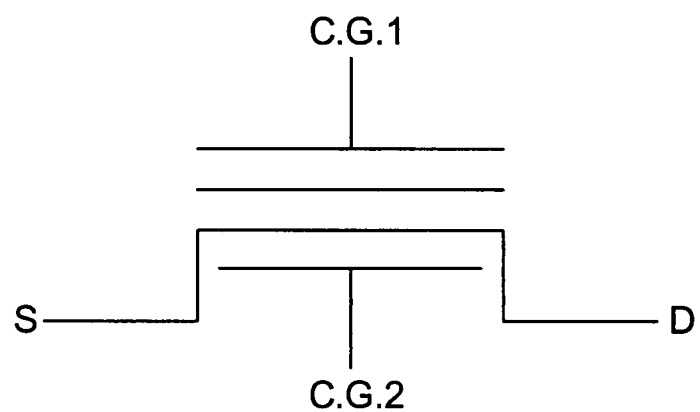
FIG. 23 is a diagram for explaining the graphic representation of each nonvolatile semiconductor memory element of the second embodiment in a circuit diagram.

FIG. 22 is a circuit diagram of the nonvolatile semiconductor memory device of this embodiment. This nonvolatile semiconductor memory device has nonvolatile semiconductor memory elements of the second embodiment arranged at lattice points. In FIG. 22, each of the nonvolatile semiconductor memory elements of the second embodiment is represented by the diagram shown in FIG. 23. In FIG. 23, the terminals denoted by S and D are the source and drain, respectively, and the terminals denoted by C.G.1 and C.G.2 are the first and second control gate electrodes, respectively. In FIG. 22, each of the nonvolatile semiconductor memory elements of the second embodiment is denoted by $Tr_{i,j}$ ($1 \leq i \leq M$, $1 \leq j \leq N$).

In the nonvolatile semiconductor memory elements arranged in the same row, the plate-like semiconductor regions forming the channels are joined to one another, and the source/drain regions of each two neighboring elements are connected. In the nonvolatile semiconductor memory elements arranged in the same column, the first control gate electrodes are connected to one another. In the nonvolatile semiconductor memory elements arranged in the same row, the second control gate electrodes are connected to one another. The combined plate-like semiconductor region of each row is connected to common lines via field effect transistors $T_{S,i}$ and $T_{D,i}$ ($1 \leq i \leq M$) at both left and right ends. The potentials of the common lines are $V_S$ and $V_D$, respectively. The potentials of the gate electrodes of the field effect transistors $T_{S,i}$ and $T_{D,i}$ ($1 \leq i \leq M$) are $V_{S,i}$ and $V_{D,i}$ ($1 \leq i \leq M$), respectively. The second control gate electrodes of each row are connected to a common line via field effect transistors $T_{CG2,i}$ ($1 \leq i \leq M$). The potential of the common line is $V_{CG2}$. The potentials of the gate electrodes of the field effect transistors $T_{CG2,i}$ ($1 \leq i \leq M$) are $V_{CG2,i}$ ($1 \leq i \leq M$). The threshold voltages of the field effect transistors $T_{S,i}$, $T_{D,i}$ and $T_{CG2,i}$ ($1 \leq i \leq M$) are substantially the same at $V_{th}$, though not necessarily being exactly equal to one other. The threshold voltage $V_{th}$ is set between zero and $V_{DD}$. The potentials of the first control gate electrodes connected to one another in the jth column are $V_{CG1,j}$ ($1 \leq j \leq N$). In FIG. 22, wirings provided outside the area shown in FIG. 22, the connection areas with the external wirings, and the likes are not shown.

The nonvolatile semiconductor memory device of this embodiment can store L×M×N bits of information in total. Here, L represents the number of bits each one nonvolatile semiconductor memory element can store. The operations of this nonvolatile semiconductor memory device are described below.

The nonvolatile semiconductor memory element of this embodiment is of the n-type, and information writing, erasing, and reading to be performed on the nonvolatile semiconductor memory element $Tr_{m,n}$ (the nonvolatile semiconductor memory element located in the mth row and in the nth column) are described below. A p-type nonvolatile semiconductor memory element performs the same operations as those described below, if the voltage polarities are reversed.

First, information writing is performed as follows. As mentioned in the second embodiment, the nonvolatile semiconductor memory elements can have various threshold voltages. As mentioned in the first embodiment, the thickness of the plate-like semiconductor region forming the channel is thinner than twice the largest thickness of a depletion layer can have depending on the impurity concentration. Accordingly, the potential of the channel region and a conductive and nonconducting state of each element are determined by the combination of potentials applied to the first and second control gate electrodes. The threshold voltages in a case where the same potentials are applied to the first and second control gate electrodes are $V_{TH,1}$, $V_{TH,2}$, ..., $V_{TH,L}$ in ascending order. The potential $V_{TH,k}$ ($2 \leq k \leq L-1$) is set between zero and $V_{DD}$. The threshold voltages in a case where a potential is applied only to the first control gate electrode while the potential of the second control gate electrode is zero are $V_{TH,1}'$, $V_{TH,2}'$ ..., $V_{TH,L}'$ in ascending order. The potential $V_{TH,k}'$ is equal to or higher than the potential $V_{TH,k}$ ($1 \leq k \leq L$), and the threshold voltage in a case where the potential of the second control gate electrode has a positive value and the second control gate electrode is in a floating state is lower than the potential $V_{TH,k}'$. When the potential $V_{CG2,i}$ ($1 \leq i \leq M$) is set at a value (such as zero) lower than $V_{th}$, the field effect transistors $T_{CG2,i}$ ($1 \leq i \leq M$) are all put into a nonconducting state. Accordingly, the second control gate electrodes of the nonvolatile semiconductor memory elements $Tr_{i,j}$ ($1 \leq i \leq M$, $1 \leq j \leq N$) are all put into a floating state.

The potential $V_{CG1,j}$ ($1 \leq j \leq N$) is set higher than $V_{TH,L}'$, but does not cause electron injection into the charge accumulating layer. With this arrangement, all the nonvolatile semiconductor memory elements $Tr_{i,j}$ ($1 \leq i \leq M$, $1 \leq j \leq N$) are put into a conductive state. Meanwhile, the potentials $V_{S,i}$ and $V_{D,i}$ ($i \neq m$) are set at a value (such as zero) lower than $V_{th}$, and the potentials $V_{S,m}$ and $V_{D,m}$ are set at a value (such as $V_{DD}$) higher than $V_{th}$. With this arrangement, the field effect transistors $T_{S,i}$ and $T_{D,i}$ ($i \neq m$) are all put into a nonconducting state, while the field effect transistors $T_{S,m}$ and $T_{D,m}$ are put into a conductive state. The potentials $V_S$ and $V_D$ are set at zero. By doing so, the source/drain regions of the nonvolatile semiconductor memory elements $Tr_{i,j}$ ($i \neq m$, $1 \leq j \leq N$) are put into a floating state, as being not connected to an external circuit. The potentials of the source/drain regions of the nonvolatile semiconductor memory elements $Tr_{m,j}$ ($1 \leq j \leq N$) become zero, as being connected to an external circuit. As a result of this, the potentials of the channel regions of the nonvolatile semiconductor memory elements $Tr_{m,j}$ ($1 \leq j \leq N$) also become zero. The potential $V_{CG1,n}$ is set at such a potential that causes electron injection into the charge accumulating layer so as to set the threshold voltage of the nonvolatile semiconductor memory element $Tr_{m,n}$ at a desired value. With this arrangement, charge injection into the charge accumulating layer of the nonvolatile semiconductor memory element $Tr_{m,n}$ is caused, and the threshold voltage of the nonvolatile semiconductor memory element $Tr_{m,n}$ can be adjusted to the desired value. The potential $V_{CG1,j}$ (j≠n) is set higher than $V_{TH,L}'$, but does not cause electron injection into a charge accumulating layer. Accordingly, neither charge injection into the charge accumulating layers of the nonvolatile semiconductor memory elements $Tr_{i,j}$ (1≦i≦M, j≠n) nor charge release from the charge accumulating layers of the nonvolatile semiconductor memory elements $Tr_{i,j}$ (1≦i≦M, j≠n) is caused. Hence, the threshold voltages of the nonvolatile semiconductor memory elements $Tr_{i,j}$ (1≦i≦M, j≠n) do not change. Since the source/drain regions of the nonvolatile semiconductor memory elements $Tr_{i,n}$ (i≠m) are in a floating state, as described above, the channel regions of the nonvolatile semiconductor memory elements $Tr_{i,n}$ (i≠m) are also in a floating state. Therefore, when the potential $V_{CG1,n}$ is changed, the potentials of the channel regions of the nonvolatile semiconductor memory elements $Tr_{i,n}$ (i≠m) follow the change in the potential $V_{CG1,n}$, because of the capacitive coupling with the control gate electrodes via the first insulating films, the charge accumulating layers, and the second insulating films. Accordingly, the electric field in each of the first insulating films of the nonvolatile semiconductor memory elements $Tr_{i,n}$ (i≠m) does not have a very high value, and charge injection into the charge accumulating layers is not caused. As a result, the threshold voltages of the nonvolatile semiconductor memory elements $Tr_{i,n}$ (i≠m) do not change. In this manner, only the threshold voltage of the nonvolatile semiconductor memory element $Tr_{m,n}$ can be controlled, without a change in the threshold voltages of the other nonvolatile semiconductor memory elements $Tr_{i,j}$ ((i,j)≠(m, n)). Thus, writing is performed.

Next, information erasing is described. Information erasing is performed simultaneously on the nonvolatile semiconductor memory elements arranged in the same column. Here, information erasing performed on the nonvolatile semiconductor memory elements of the nth column is described. The potentials $V_{S,i}$, $V_{D,i}$, and $V_{CG2,i}$ (1≦i≦M) are set at values (such as $V_{DD}$) higher than $V_{th}$. Accordingly, the field effect transistors $T_{S,i}$, $T_{D,i}$, and $T_{CG2,i}$ (1≦i≦M) are put into a conductive state. The potentials $V_S$ and $V_D$ are set at zero, and the potential $V_{CG2}$ is set higher than $V_{TH,L}$. The potential $V_{CG1,j}$ (j≠n) is also set higher than $V_{TH,L}$, but does not cause electron injection into the charge accumulating layers. The potential $V_{CG1,n}$ is set at a sufficiently low value, so as to cause electron release from the charge accumulating layers. With this arrangement, the nonvolatile semiconductor memory elements $Tr_{i,j}$ (1≦i≦M, j≠n) are all put into a conductive state, and the potentials of the source/drain regions and the channel regions become all zero. Accordingly, the potentials of the source/drain regions of the nonvolatile semiconductor memory elements $Tr_{i,n}$ (1≦i≦M) also become zero. The potential $V_{CG1,j}$ (j≠n) is set higher than $V_{TH,L}$, but does not cause electron injection into charge accumulating layers. Accordingly, neither charge injection into the charge accumulating layers of the nonvolatile semiconductor memory elements $Tr_{i,j}$ (1≦i≦M, j≠n) nor charge release from the charge accumulating layers of the nonvolatile semiconductor memory elements $Tr_{i,j}$ (1≦i≦M, j≠n) is caused. Since the source/drain regions of each nonvolatile semiconductor memory element of the second embodiment has an overlapping portion with the charge accumulating layer, the electric field in the first insulating film in the overlapping area between the charge accumulating layer and the source/drain regions has such a value to cause electron release from the charge accumulating layer. Accordingly, electron release from the charge accumulating layers of the nonvolatile semiconductor memory elements $Tr_{i,n}$ (1≦i≦M) is caused. In this manner, only the information stored in the nonvolatile semiconductor memory elements $Tr_{i,n}$ (1≦i≦M) can be selectively erased, without a change in the information stored in the nonvolatile semiconductor memory elements (1≦i≦M, j≠n).

Writing and erasing are performed as described above.

Next, reading is described. Reading information from the nonvolatile semiconductor memory element $Tr_{m,n}$ is performed as follows. The potential $V_{CG2,i}$ (i≠m) is set at a value (such as zero) lower than $V_{th}$. With this arrangement, the field effect transistors $T_{CG2,i}$ (i≠m) are all put into a nonconducting state, and the second control gate electrodes of the nonvolatile semiconductor memory elements $Tr_{i,j}$ (i≠m, 1≦j≦N) are all put into a floating state. When the potential $V_{CG2,m}$ is set at a value (such as $V_{DD}$) higher than $V_{th}$, the field effect transistor $T_{CG2,m}$ is put into a conductive state, and the potential of the second control gate electrodes of the nonvolatile semiconductor memory elements $Tr_{m,j}$ (1≦j≦N) becomes $V_{CG2}$. The potential $V_{CG2}$ is zero, for example. When the potential $V_{CG1,j}$ (i≠n) is set at a higher potential than $V_{TH,L}'$ under the circumstances, the nonvolatile semiconductor memory elements $Tr_{i,j}$ (1≦i≦M, j≠n) are all put into a conductive state. The potential $V_S$ is set at zero, and the potential $V_D$ is set at $V_{DD}$, for example. The potentials $V_{S,i}$ and $V_{D,i}$ (i≠m) are set at a value (such as zero) lower than $V_{th}$, and the potentials $V_{S,m}$ and $V_{D,m}$ are set at $V_{DD}$, for example. With this arrangement, the field effect transistors $T_{S,i}$ and $T_{D,i}$ (i≠m) are all put into a nonconducting state, while the field effect transistors $T_{S,m}$ and $T_{D,m}$ are put into a conductive state. Here, the source/drain regions of the nonvolatile semiconductor memory elements $Tr_{i,j}$ (i≠m, 1≦j≦N) are put into a floating state, as being not connected to an external circuit. As the nonvolatile semiconductor memory elements $Tr_{m,j}$ (j≠n) are in a conductive state here, the source/drain regions of the nonvolatile semiconductor memory elements $Tr_{m,j}$ (1≦j≦N) are connected to an external circuit. Accordingly, the potentials of the source/drain regions of the nonvolatile semiconductor memory elements $Tr_{m,j}$ (1≦j≦n) and the potential of the portion of the source/drain regions of the nonvolatile semiconductor memory element $Tr_{m,n}$ located at the left side of FIG. 22 become zero, while the potentials of the source/drain regions of the nonvolatile semiconductor memory elements $Tr_{m,j}$ (n<j≦N) and the potential of the portion of the source/drain regions of the nonvolatile semiconductor memory element $Tr_{m,n}$ located at the right side of FIG. 22 become $V_{DD}$. Here, the potentials $V_{CG1,n}$ and $V_{CG2}$ is set at $V_{DD}$, for example. Since the potential $V_{CG1,j}$ (j≠n) is set higher than $V_{TH,L}'$, all the nonvolatile semiconductor memory elements $Tr_{m,j}$ (j≠n) remain in a conductive state. Here, a current corresponding to the threshold voltage of the nonvolatile semiconductor memory element $Tr_{m,n}$ flows from the terminal having the potential $V_D$ applied thereto to the terminal having the potential $V_S$ applied thereto. Accordingly, the information stored in the nonvolatile semiconductor memory element $Tr_{m,n}$ can be read out by detecting the current. Alternatively, the potentials $V_{CG1,n}$ and $V_{CG2}$ are set at $V_{DD}/2$, for example. Since the potential $V_{CG1,j}$ (i≠n) is set higher than $V_{TH,L}'$, all the nonvolatile semiconductor memory elements $Tr_{m,j}$ (j≠n) remain in a conductive state. Here, a current flowing from the terminal having the potential $V_D$ applied thereto to the terminal having the potential $V_S$ applied thereto is detected, so as to determine whether the threshold voltage of the nonvolatile semiconductor memory element $Tr_{m,n}$ is higher or lower than $V_{DD}/2$. If the threshold voltage of the nonvolatile semiconductor memory element $Tr_{m,n}$ is determined to be higher than $V_{DD}/2$, the potentials $V_{CG1,n}$ and $V_{CG2}$ are set at $3 \times V_{DD}/4$, for example. Since the potential $V_{CG1,j}$ (j≠n) is set higher than $V_{TH,L}'$, all the nonvolatile semiconductor memory elements $Tr_{m,j}$ (j≠n) remain in a conductive state. A current flowing from the terminal having the potential $V_D$ applied thereto to the terminal having the potential $V_S$ applied thereto is then detected, so as to determine whether the threshold voltage of the nonvolatile semiconductor memory element $Tr_{m,n}$ is higher or lower than $3 \times V_{DD}/4$. If the threshold voltage of the nonvolatile semiconductor memory element $Tr_{m,n}$ is determined to be lower than $V_{DD}/2$, the potentials $V_{CG1,n}$ and $V_{CG2}$ are set at $V_{DD}/4$, for example. Since the potential $V_{CG1,j}$ (j≠n) is set higher than $V_{TH,L}'$, all the nonvolatile semiconductor memory elements $Tr_{m,j}$ (j≠n) remain in a conductive state. A current flowing from the terminal having the potential $V_D$ applied thereto to the terminal having the potential $V_S$ applied thereto is detected, so as to determine whether the threshold voltage of the nonvolatile semiconductor memory element $Tr_{m,n}$ is higher or lower than $V_{DD}/4$. The threshold voltage of the nonvolatile semiconductor memory element $Tr_{m,n}$ can be determined by repeating those procedures. The former method has the advantage of reading out the information stored in the nonvolatile semiconductor memory element $Tr_{m,n}$ through one procedure. The latter method has the advantage that the detection can be performed after amplification by a sense amplifier or the like, and a read error can be avoided, since each procedure only involves determining whether a current is flowing.

In this manner, each of the nonvolatile semiconductor memory elements can store L bits of information independently, and the nonvolatile semiconductor memory device can store L×M×N bits of information in total.

In this embodiment, a nonvolatile semiconductor memory device is formed with nonvolatile semiconductor memory elements of the second embodiment. Accordingly, as in the second embodiment, elements can be formed in cycles twice the cycles of the minimum process size both in the row direction and the column direction of FIG. 22. Thus, the area of each one element can be four times as large as the square of the smallest process size. As a result, higher integration can be achieved. On the other hand, the formation of a nonvolatile semiconductor memory device of the third embodiment with the use of nonvolatile semiconductor memory elements of the first embodiment has the advantage of a simplified circuit structure, as the first control gate electrode and the second control gate electrode of each element are integrally formed.

As described so far, this embodiment can provide a high-performance nonvolatile semiconductor memory device that has high controllability over the threshold voltages, restrains variations of the threshold voltages, and can have more than two threshold voltages while lowering the power supply voltage.

The various modifications as described in the foregoing embodiments may also be made to this embodiment, and the same effects as above can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A nonvolatile semiconductor memory element comprising:
   a semiconductor substrate;
   an embedded insulating film having a first lower face facing to an upper face of the semiconductor substrate, a first upper face opposed to the first lower face, a first side face different from the first lower and upper faces, and a second side face opposed to the first side face;
   a semiconductor layer of a first conductivity type having a second lower face facing to the first upper face, a second upper face opposed to the second lower face, a third side face different from the second lower and upper faces, and a fourth side face opposed to the third side face;
   source/drain regions of a second conductivity type provided in the semiconductor layer at a distance from each other;
   a first insulating film provided on a portion in the second upper face of the semiconductor layer, the portion being located between the source/drain regions, and the first insulating film having a third lower face facing to the second upper face, a third upper face opposed to the third lower face, a fifth side face different from the third lower and upper faces, and a sixth side face opposed to the fifth side face;
   a charge accumulating layer having a fourth lower face facing to the third upper face, a fourth upper face opposed to the fourth lower face, a seventh side face different from the fourth lower and upper faces, and an eighth side face opposed to the seventh side face;
   a second insulating film having a fifth lower face facing to the fourth upper face, a fifth upper face opposed to the fifth lower face, a ninth side face different from the fifth lower and upper faces, and a tenth side face opposed to the ninth side face;
   a first control gate electrode provided on the fifth upper face of the second insulating film and extending in a direction which is perpendicular to a line directed from the source region to the drain region and parallel to the upper face of the semiconductor substrate; and
   a second control gate electrode having a sixth lower face facing to the upper face of the semiconductor substrate, a sixth upper face opposed to the sixth lower face, an eleventh side face different from the sixth lower and upper faces, and a twelfth side face opposed to the eleventh side face, and provided between the semiconductor substrate and the embedded insulating film,
   wherein the eleventh side face of the second control gate electrode, the first side face of the embedded insulating film, the third side face of the semiconductor layer, the fifth side face of the first insulating film, the seventh side face of the charge accumulating layer, and the ninth side face of the second insulating film are parallel to the line directed from the source region to the drain region and in contact with a first vertical plane, and the twelfth side face of the second control gate electrode, the second side face of the embedded insulating film, the fourth side face of the semiconductor layer, the sixth side face of the first insulating film, the eighth side face of the charge accumulating layer, and the tenth side face of the second insulating film are parallel to the line directed from the source region to the drain region and in contact with a second vertical plane, and
   wherein the source/drain regions are on either side of the charge accumulating layer, and the source/drain regions and the charge accumulating layer have at least one overlapping portion when viewed from the fourth upper face of the charge accumulating layer.

2. The memory element according to claim 1, wherein the sum of an equivalent oxide thickness of the first insulating film and an equivalent oxide thickness of the second insulating film is equal to or greater than an equivalent oxide thickness of the embedded insulating film.

3. The memory element according to claim 2, wherein the embedded insulating film has a dielectric constant equal to or higher than a dielectric constant of the first insulating film.

4. The memory element according to claim 1, wherein the first insulating film has an equivalent oxide thickness equal to or greater than an equivalent oxide thickness of the second insulating film.

5. The memory element according to claim 4, wherein the second insulating film has a dielectric constant equal to or higher than a dielectric constant of the first insulating film.

6. The memory element according to claim 1, wherein:
the second control gate electrode is provided in a portion of the semiconductor substrate, the portion of the semiconductor substrate being located below the source/drain regions and below the semiconductor layer between the source/drain regions;
the second control gate electrode and the source/drain regions have the substantially same lengths in an extending direction of the first control gate electrode that is perpendicular to the second control gate electrode.

7. A nonvolatile semiconductor memory device comprising
a plurality of nonvolatile semiconductor memory elements according to claim 1, wherein:
the nonvolatile semiconductor memory elements are arranged in a lattice form;
the source/drain regions of each two neighboring ones of the nonvolatile semiconductor memory elements arranged in the same row are connected to each other;
the first control gate electrodes of the nonvolatile semiconductor memory elements arranged in the same column are connected to one another; and
the second control gate electrodes of the nonvolatile semiconductor memory elements arranged in the same row are connected to one another.

8. The memory device according to claim 7, wherein the sum of an equivalent oxide thickness of the first insulating film and an equivalent oxide thickness of the second insulating film is equal to or greater than an equivalent oxide thickness of the embedded insulating film.

9. The memory device according to claim 8, wherein the embedded insulating film has a dielectric constant equal to or higher than a dielectric constant of the first insulating film.

10. The memory device according to claim 7, wherein the first insulating film has an equivalent oxide thickness equal to or greater than an equivalent oxide thickness of the second insulating film.

11. The memory device according to claim 10, wherein the second insulating film has a dielectric constant equal to or higher than a dielectric constant of the first insulating film.

12. The memory device according to claim 7, wherein the semiconductor layer has a thickness equal to or smaller than twice the largest depletion layer thickness determined by an impurity concentration in the semiconductor layer.

13. The memory device according to claim 7, wherein:
the second control gate electrode is provided in a portion of the semiconductor substrate, the portion of the semiconductor substrate being located below the source/drain regions and below the semiconductor layer between the source/drain regions;
the second control gate electrode and the source/drain regions have the substantially same lengths in an extending direction of the first control gate electrode that is perpendicular to the second control gate electrode.

14. The memory element according to claim 1, wherein the semiconductor layer has a thickness equal to or smaller than twice the largest depletion layer thickness determined by an impurity concentration in the semiconductor layer.

* * * * *